(12) United States Patent
Tsai et al.

(10) Patent No.: US 11,054,803 B2
(45) Date of Patent: Jul. 6, 2021

(54) MOTOR DRIVE, PRODUCTION SYSTEM AND METHOD THEREOF WITH QUALITY MEASURING AND MECHANISM DIAGNOSING FUNCTIONS USING REAL AND VIRTUAL SYSTEM MODULES

(71) Applicant: Delta Electronics, Inc., Taoyuan (TW)

(72) Inventors: Ching-Hsiung Tsai, Taoyuan (TW); Yen-Ming Lu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 237 days.

(21) Appl. No.: 16/460,095

(22) Filed: Jul. 2, 2019

(65) Prior Publication Data
US 2020/0019137 A1    Jan. 16, 2020

Related U.S. Application Data

(60) Provisional application No. 62/697,659, filed on Jul. 13, 2018.

(30) Foreign Application Priority Data

Apr. 30, 2019  (CN) .......................... 201910364653.0

(51) Int. Cl.
    *G05B 19/406* (2006.01)
    *H01L 21/67* (2006.01)
    *G05B 19/416* (2006.01)

(52) U.S. Cl.
    CPC ......... *G05B 19/406* (2013.01); *G05B 19/416* (2013.01); *H01L 21/67276* (2013.01);
    (Continued)

(58) Field of Classification Search
    None
    See application file for complete search history.

(56) References Cited

U.S. PATENT DOCUMENTS

| | | | |
|---|---|---|---|
| 6,662,073 B1* | 12/2003 | Fujishima .......... | G05B 19/4069 700/109 |
| 2005/0154488 A1* | 7/2005 | Esterling ............ | G05B 19/4065 700/175 |

(Continued)

FOREIGN PATENT DOCUMENTS

| | | |
|---|---|---|
| CN | 101278246 A | 10/2008 |
| CN | 101615023 A | 12/2009 |

(Continued)

OTHER PUBLICATIONS

English translation of Fujii et al. Japanese Patent Publication No. 2015023585, published Feb. 2, 2015.*

(Continued)

*Primary Examiner* — Bernard G Lindsay
(74) *Attorney, Agent, or Firm* — Kirton McConkie; Evan R Witt

(57) ABSTRACT

A production system, a drive and an operating method provide the functions of quality measurement and mechanism diagnosis. The production system has a hierarchical processing structure. The drive includes a real system driving module and a virtual system driving module. The real system driving module generates a mechanism real operation parameter information. In a system identification mode, the drive creates at least one virtual mechanism model. The drive generates a mechanism stimulation operation parameter information according to a processing strategy of a controller, the mechanism real operation parameter information and the at least one virtual mechanism model. The controller performs a quality measurement operation, performs a mechanism diagnosis operation and/or adjusts the processing strategy according to the mechanism real operation parameter information and the mechanism stimulation operation parameter information.

19 Claims, 10 Drawing Sheets

(52) U.S. Cl.
CPC ............. *G05B 2219/32179* (2013.01); *G05B 2219/41329* (2013.01)

(56) References Cited

U.S. PATENT DOCUMENTS

| | | | |
|---|---|---|---|
| 2010/0082120 A1* | 4/2010 | Stephenson | D21G 9/0009 700/29 |
| 2017/0109646 A1 | 4/2017 | David | |
| 2017/0262572 A1* | 9/2017 | Mori | G05B 17/02 |
| 2018/0267504 A1* | 9/2018 | Amthor | G05B 17/02 |
| 2019/0137984 A1* | 5/2019 | Maekawa | G01M 13/028 |
| 2019/0348942 A1* | 11/2019 | Onodera | H02P 29/00 |

FOREIGN PATENT DOCUMENTS

| | | |
|---|---|---|
| CN | 103760820 A | 4/2014 |
| CN | 104218863 A | 12/2014 |
| CN | 105563329 A | 5/2016 |
| CN | 107943121 A | 4/2018 |
| CN | 108027603 A | 5/2018 |
| TW | 200625779 A | 7/2006 |
| TW | 200848199 A | 12/2008 |
| TW | 201238232 A | 9/2012 |
| TW | 201613018 A | 4/2016 |
| TW | 201728518 A | 8/2017 |
| TW | 201817303 A | 5/2018 |

OTHER PUBLICATIONS

Guo et al. 'The Research on Virtual Simulation of Lead Screw System' Proceedings of the IEEE International Conference on Information and Automation Ningbo, China, Aug. 2016.*

Jonsson et al. 'A virtual machine concept for real-time simulation of machine tool dynamics' International Journal of Machine Tools & Manufacture 45 (2005) 795-801.*

Saez et al. 'Real-Time Hybrid Simulation of Manufacturing Systems for Performance Analysis and Control' 2015 IEEE International Conference on Automation Science and Engineering (CASE) Aug. 24-28, 2015.*

* cited by examiner

MOTOR DRIVE, PRODUCTION SYSTEM AND METHOD THEREOF WITH QUALITY MEASURING AND MECHANISM DIAGNOSING FUNCTIONS USING REAL AND VIRTUAL SYSTEM MODULES

CROSS-REFERENCE TO RELATED APPLICATION

This application claims the benefit of U.S. Provisional Application No. 62/697,659 filed on Jul. 13, 2018, and entitled "MODEL AND CONTROL FOR EXTERNAL FORCE MEASUREMENT AND MECHANISM DIAGNOSIS", the entirety of which is hereby incorporated by reference.

FIELD OF THE INVENTION

The present disclosure relates to a production system, and more particularly to a production system with a quality measuring function and a mechanism diagnosing function, a drive and a production method.

BACKGROUND OF THE INVENTION

As known, increasing product yield is a key factor of profitability in the high-tech industries. For achieving this purpose, all processed semi-processed products and processed products need to be thoroughly inspected in the production process. However, it is necessary to purchase a large number of measuring machines and take a lot of production time to implement the total inspection method. For saving cost and time, a sampling inspection method is widely used in the industry to monitor the quality of the processed product. However, the sampling inspection method cannot achieve the total quality management purpose. For performing the thorough inspection in a cost-effective manner, a virtual metrology (VM) technique is applied to a production system with a production device.

For example, the VM technique is widely used in the production devices for manufacturing the semiconductor components, display panels or solar energy products. By using the VM technique, the quality of the processed products can be estimated according to the operation parameters of the production device for producing the processed products without the actual measurement of the processed products. Consequently, the quality of the processed product can be predicted on-line and in real time. In such way, the total inspection efficacy is achieved. Since the abnormality of the processed product can be found immediately, the serious loss is avoided.

However, the conventional virtual metrology technique still has some drawbacks. For example, it is difficult to simultaneously increase both of immediateness and accuracy. If the user intends to output the virtual measurement value immediately, the accuracy of the virtual measurement value is not high. Whereas, if the user intends to ensure the accuracy of the virtual measurement value, the virtual measurement value cannot be outputted immediately. Moreover, the conventional virtual metrology technique is only able to predict the virtual measurement value but unable to provide a reliance index about the virtual measurement value. Since the user cannot confirm the reliability of the virtual measurement value, the virtual measurement value cannot be used with reliance. Moreover, the physical characteristics of the machines or production devices in the same type are not always identical. For maintaining the estimation accuracy of the virtual metrology, it is necessary to create the virtual prediction models according to the characteristic data of the machines or production devices. However, the process of introducing the virtual metrology technique into all machines or production devices of the whole plant is labor-intensive and costly. For overcoming the above drawbacks, an automatic virtual metrology server and an automatic virtual metrology method have been provided.

The automatic virtual metrology technique provides enhanced immediateness and accuracy through the generation of two-stage virtual measurement values. In the first stage, a process parameter of a specified processed product is acquired, and the first-stage virtual measurement value of the specified processed product is estimated immediately. Consequently, the requirement of the immediateness can be achieved. In the second stage, a measuring device is used to acquire the actual measurement value of the sampled processed product, and then the second-stage virtual measured value of the sampled processed product is recalculated for retraining and calibration. Consequently, the accuracy is enhanced. The automatic virtual metrology technique also generates the reliance index of the first-stage virtual measurement value, the reliance index of the second-stage virtual measurement value and the global similarity index in order to estimate the reliability of the virtual measurement value.

Although the above virtual metrology technique provides enhanced immediateness and accuracy, there are still some drawbacks. Since the conventional virtual metrology technique usually uses pure numeric analysis methods such as neural network methods and multiple regression algorithms to establish the virtual prediction models of processed products, the conventional virtual metrology technique cannot reflect the physical state of the processing machine. In other words, the accuracy of the virtual measurement is not effectively increased. If more accurate virtual measurement results are needed, it is necessary to install a large number of additional sensors on the machine or production device to acquire the processing parameters. After the processing parameters are acquired by the additional sensors, the establishment and measurement of the virtual estimation model can be carried out. However, since these sensors have to be wired to the local server, the wiring process is difficult, the transmission wire is long and the cost of the hardware architecture is high. Moreover, the conventional virtual metrology technique is only able to evaluate the quality of the processed product but unable to distinguish or know the cause of the defective product. Consequently, if the defective product is found, the processing parameters of machine or production device cannot be adjusted and modified immediately. Moreover, when the conventional virtual metrology technique is applied to a production system with a processing tool, some problems occur. For example, the external force disturbance, the mechanism-related aging problem and other variation factor may influence the quality of the processed product. Since the conventional virtual metrology technique cannot separate the external force disturbance from the mechanism-related aging problem, the accuracy of estimating the product quality is impaired, and the deterioration degree of the mechanism and the timing of replacing or maintaining the mechanism are not known. Moreover, the conventional virtual metrology technique uses the aggregate calculation architecture. That is, the measurement and analysis are implemented on the local server. After the processing parameters are acquired by the additional sensors on the machine or the production device, the processing parameters are transmitted to the local server and processed and computed by the local server. Since the local server needs a large amount of storage space and powerful computing power, the hardware cost is very high, the computing burden of the local server is increased, and the computing efficiency of the local server is reduced.

For overcoming the drawbacks of the conventional technologies, the production system, the drive and the production method need to be further improved.

SUMMARY OF THE INVENTION

An object of the present disclosure provides a production system, a drive and an operating method of the production system in order to overcome the drawbacks of the conventional technologies.

Another object of the present disclosure provides a production system, a drive and an operating method of the production system in order to measure and monitor the quality of the product, perform the mechanism diagnosis operation, predict the deterioration and achieve the intelligent control function.

A further object of the present disclosure provides a production system, a drive and an operating method of the production system in order to provide the MCMD functions. The production system has the hierarchical processing structure in order to reduce the burdens of transferring and computing data, simplify the wiring structure, increase the operating efficiency, predict the product quality immediately, predict the external force disturbance, increase the prediction accuracy, monitor the production capability of the production device, adjust the processing strategy according to the mechanism variation, optimize the production capability, perform the mechanism diagnosis operation, predict the deterioration and reduce the hardware and measuring cost.

In accordance with an aspect of the present disclosure, a drive for driving a motor of a production device is provided. The drive is controlled by a controller of the production device. The production device is selectively in a system identification mode, a processing mode or an idle mode. The production device manufactures a processed product in the processing mode. The drive includes a real system driving module and a virtual system driving module. When the production device is in the processing mode, the real system driving module generates a mechanism real operation parameter information according to a processing strategy of the controller and an external force disturbance. The virtual system driving module includes a quality measurement and mechanism diagnosis parameter processing module. When the production device is in the system identification mode, the quality measurement and mechanism diagnosis parameter processing module creates at least one virtual mechanism model. When the production device is in the processing mode or the idle mode, the quality measurement and mechanism diagnosis parameter processing module generates a mechanism stimulation operation parameter information according to the processing strategy of the controller, the mechanism real operation parameter information and the at least one virtual mechanism model. The mechanism real operation parameter information and the mechanism stimulation operation parameter information are transmitted to the controller so as to perform a quality measurement operation, perform a mechanism diagnosis operation and/or adjust the processing strategy.

In accordance with another aspect of the present disclosure, a production system is provided. The production system increases a production device, a local server and a quality measurement and mechanism diagnosis module. The production device is selectively operated in a system identification mode, a processing mode or an idle mode. The production device manufactures a processed product in the processing mode. The production device includes at least one motor, at least one sensor, at least one controller and at least one drive. The at least one sensor senses the at least one motor and a motor-related mechanism to acquire at least one operation parameter. The at least one controller provides a processing strategy. The at least one drive is connected with the at least one motor and the at least one controller to receive the at least one operation parameter from the at least one sensor and drive operations of the motor according to the processing strategy. The drive includes a real system driving module and a virtual system driving module. When the production device is in the processing mode, the real system driving module generates a mechanism real operation parameter information according to the processing strategy of the controller and an external force disturbance. The virtual system driving module includes a quality measurement and mechanism diagnosis parameter processing module. When the production device is in the system identification mode, the quality measurement and mechanism diagnosis parameter processing module creates at least one virtual mechanism model. When the production device is in the processing mode or the idle mode, the quality measurement and mechanism diagnosis parameter processing module generates a mechanism stimulation operation parameter information according to the processing strategy of the controller, the mechanism real operation parameter information and the at least one virtual mechanism model. The local server is connected with the controller. The quality measurement and mechanism diagnosis module is installed in at least one of the controller and the local server. The quality measurement and mechanism diagnosis module performs a quality measurement operation, performs a mechanism diagnosis operation and/or adjusts the processing strategy according to the mechanism real operation parameter information and the mechanism stimulation operation parameter information.

In accordance with a further aspect of the present disclosure, an operating method for a production system is provided. The production system includes a production device, a local server and a quality measurement and mechanism diagnosis module. The production device includes at least one motor, at least one sensor, at least one controller and at least one drive. The drive includes a real system driving module and a virtual system driving module. The quality measurement and mechanism diagnosis module is installed in at least one of the controller and the local server. The operating method includes the following steps. In a step (S1), the production device enters a system identification mode, so that the virtual system driving module of the drive creates at least one virtual mechanism model. In a step (S2), the controller generates a processing strategy to the drive to drive operations of the motor. In a step (S3), the production device enters a processing mode, so that the real system driving module of the drive generates a mechanism real operation parameter information according to the processing strategy of the controller and an external force disturbance and the virtual system driving module generates a mechanism stimulation operation parameter information. The mechanism real operation parameter information includes a motor driving command and a motor operation parameter information. The mechanism stimulation operation parameter information includes a pre-estimated external force disturbance. In a step (S4), the production device manufactures at least one processed product. The quality measurement and mechanism diagnosis module performs a quality measurement operation on the processed product according to the motor operation parameter information and the pre-estimated external force disturbance.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
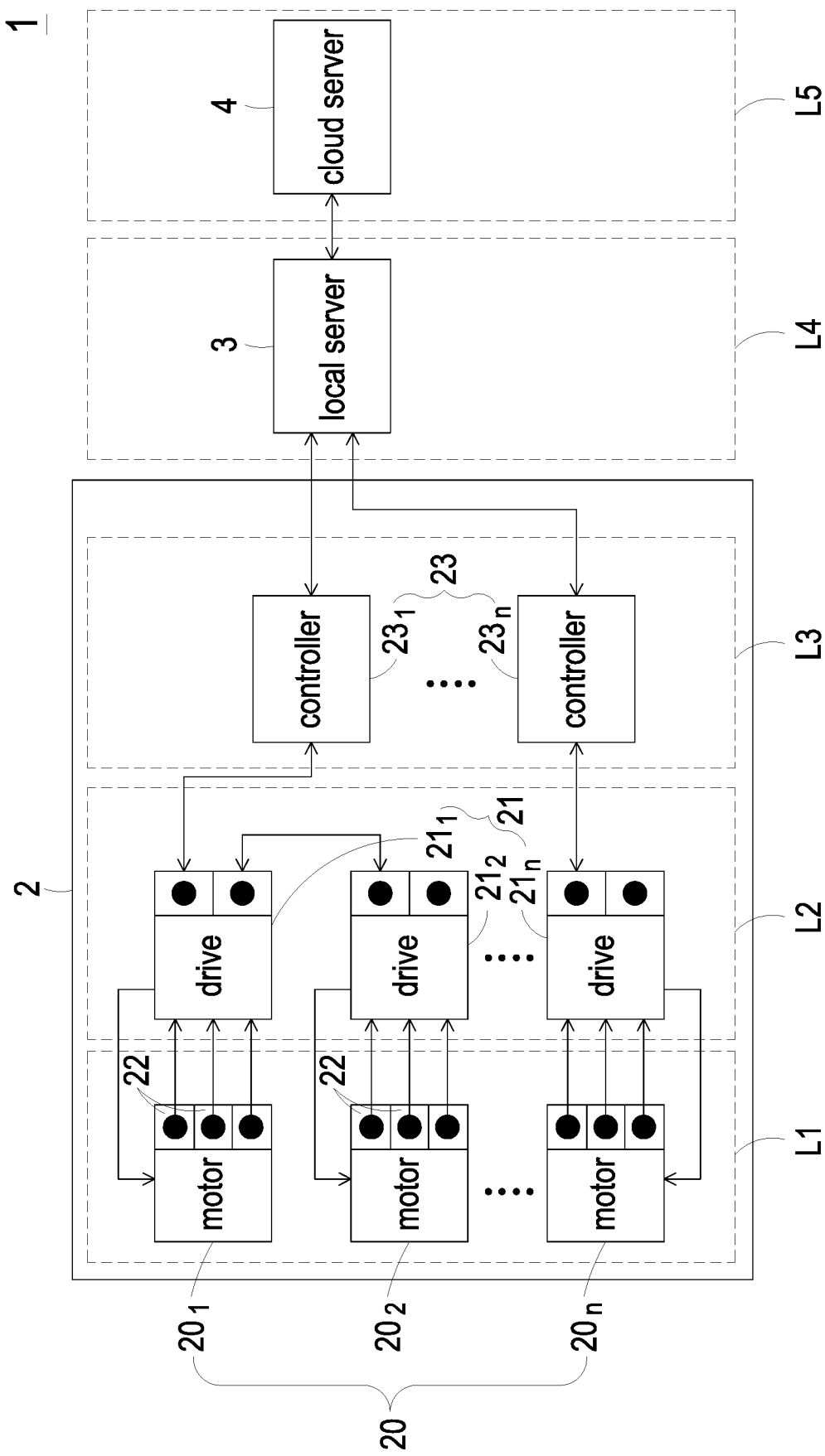
FIG. 1 is a schematic functional block diagram illustrating the architecture of a production system according to an embodiment of the present disclosure.
Figure 2:
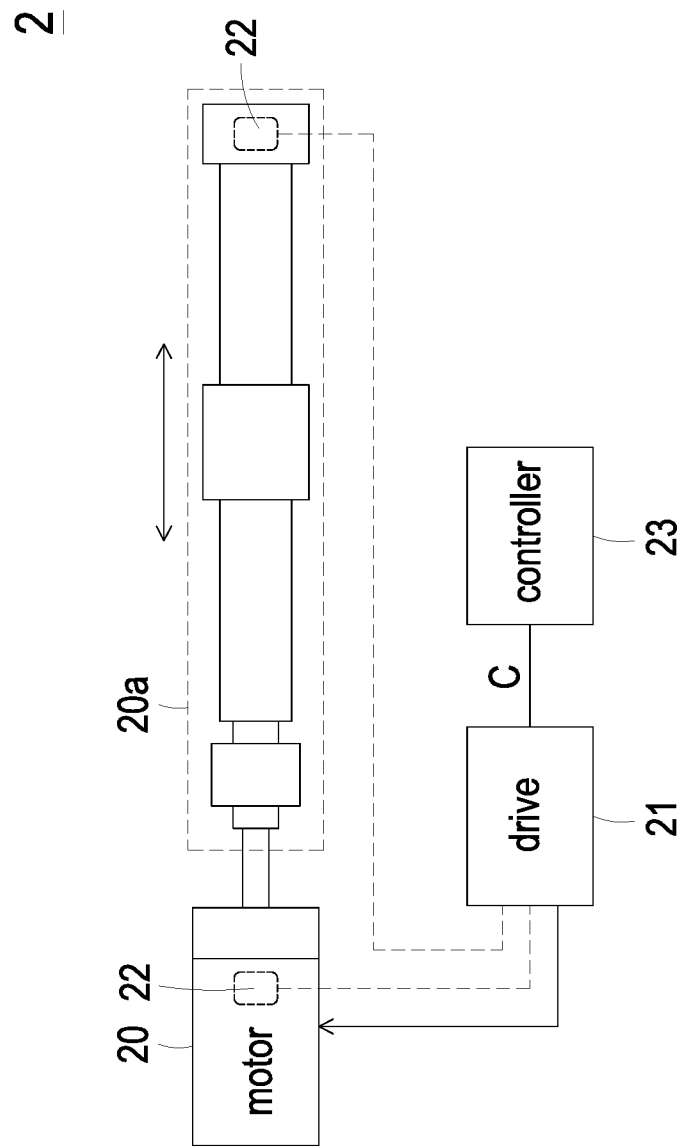
FIG. 2 is a functional block illustrating an example of a production device of the production system as shown in FIG. 1.
Figure 3:
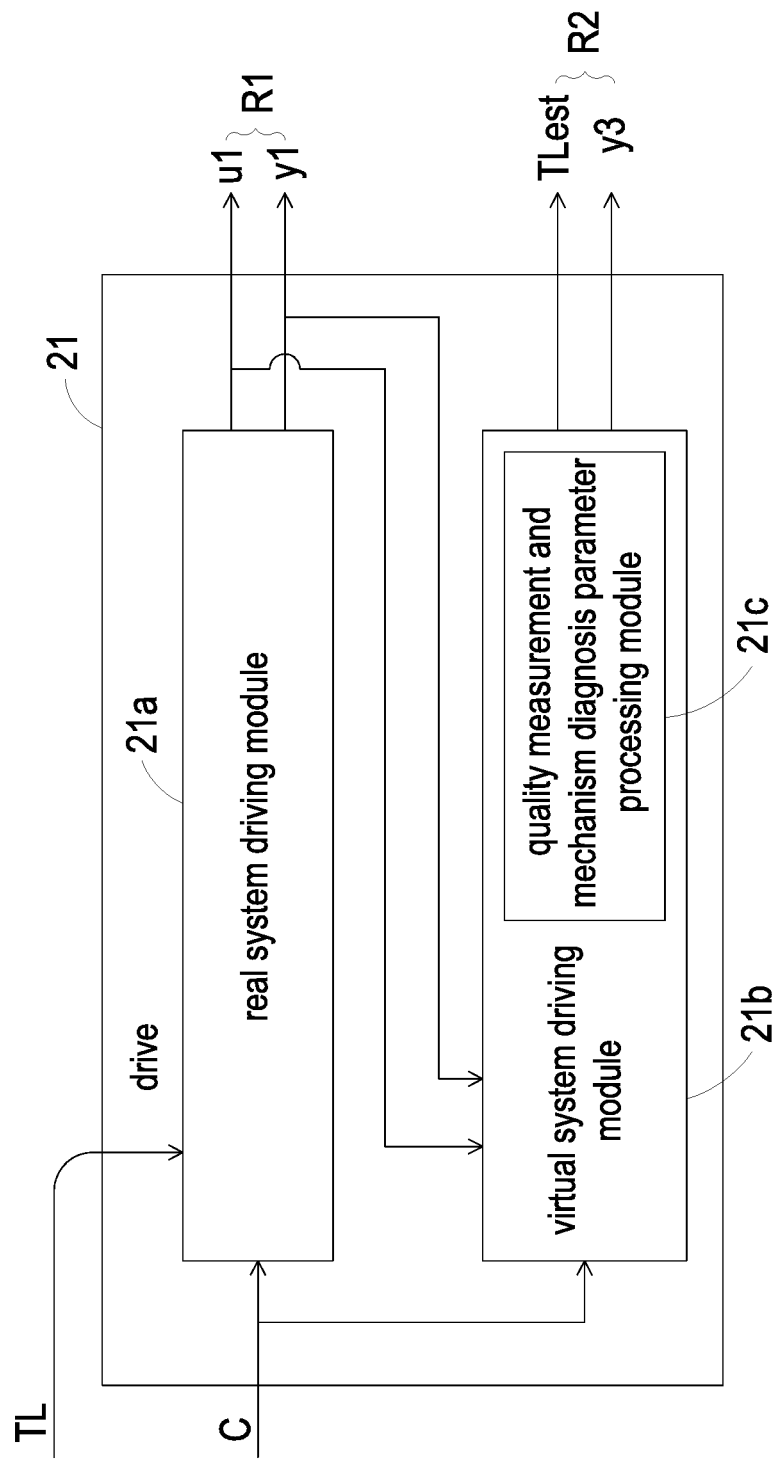
FIG. 3 is a functional block illustrating an example of a drive as shown in FIG. 1.

Please refer to FIGS. 1, 2 and 3. FIG. 1 is a schematic functional block diagram illustrating the architecture of a production system according to an embodiment of the present disclosure. FIG. 2 is a functional block illustrating an example of a production device of the production system as shown in FIG. 1. FIG. 3 is a functional block illustrating an example of a drive as shown in FIG. 1.

The production system 1 includes at least one production device 2 and a local server 3. Preferably but not exclusively, the production device 2 is a machine tool with at least one axle. For example, the production device 2 is a milling machine. The production device 2 is selectively in a system identification mode, a processing mode or an idle mode. After the production device 2 is equipped with a processing tool (e.g., a cutting tool) and the production device 2 is enabled, the production device 2 enters the system identification mode. When the production device 2 is in the processing mode, the production device 2 performs a processing operation to manufacture at least one processed product. When the processing tool is temporarily removed from the production device 2, the production device 2 is in the idle mode. The production device 2 in the idle mode executes the same commands as the production device 2 in the processing mode. However, the production device 2 in the idle mode cannot manufacture the processed product.

The production device 2 includes at least one motor 20, at least one motor-related mechanism 20a, at least one drive 21, at least one sensor 22 and at least one controller 23. The motor 20 and the motor-related mechanism 20a are used for moving a processing tool to perform a processing operation on a workpiece. The drive 21 is electrically connected with the corresponding motor 20 to drive the operation of the motor 20. The sensor 22 is used for sensing at least one operation parameter of the motor 20 and the motor-related mechanism 20a and providing the operation parameter to the drive 21. The controller 23 is electrically connected with the corresponding drive 21 to control the drive 21 to drive the operations of the motor 20.

In this embodiment, the motor 20 is a core mechanism of the production device 2 for performing the processing operation. Consequently, the condition and quality of the processed product manufactured by the production device 2 are highly related to the operating condition of the motor 20. When the production device 2 is in the system identification mode, the processing mode or the idle mode, the motor 20 works. During the operation of the motor 20 or the motor-related mechanism 20a, at least one motor operation parameter is sensed and acquired by the sensor 22. For example, the at least one motor operation parameter includes the speed, the displacement, the electric energy and/or the vibration amount. Preferably but not exclusively, the sensor 22 is built in the corresponding motor 20 and/or the motor-related mechanism 20a (see FIGS. 1 and 2). In another embodiment, the sensor 22 is installed in the drive 21. It is noted that the sensor 22 may be located at any appropriate component of the production device 2. Alternatively, the sensor 22 is externally installed on any appropriate component of the production device 2.

According to a control command from the user, the controller 23 generates a processing strategy C (also referred as a processing trajectory strategy) to control the drive 21. In some embodiment, the controller 23 has the functions of storing, estimating, diagnosing and analyzing data. According to the processing strategy C from the controller 23, the drive 21 drives the motor 20 to perform a corresponding processing operation. As mentioned above, the at least one motor operation parameter of the motor 20 or the motor-related mechanism 20a is sensed by the sensor 22. The at least one motor operation parameter is transmitted from the sensor 22 to the drive 21. After the information about the at least one motor operation parameter and the processing strategy C are processed, the drive 21 provides a mechanism real operation parameter information R1 and a mechanism stimulation operation parameter information R2 of the production device 2 to the controller 23. Then, the operation parameter information of the production device 2 (including the mechanism real operation parameter information R1 and the mechanism stimulation operation parameter information R2) is stored in the controller 23. According to the operation parameter information of the production device 2, the controller 23 estimates the quality of the product, diagnoses the health of the mechanism, predicts the deterioration and adjusts the processing strategy C.

The local server 3 is connected with the controller 23. In an embodiment, the local server 3 acquires the operation parameter information of the production device 2 through the controller 23 of the production device 2. Moreover, the operation parameter information of the production device 2 is stored in the local server 3. According to the operation parameter information of the production device 2, the local server 3 estimates the quality of the product, diagnoses the health of the mechanism, predicts the deterioration and adjusts the processing strategy C.

Please refer to FIG. 1 again. In an embodiment, the production device 2 includes a plurality of motors $20_1$, $20_2$, ..., $20_n$, a plurality of drives $21_1$, $21_2$, ..., $21_n$, a plurality of sensors 22, and a plurality of controllers $23_1$, ..., $23_n$, wherein n is an integer larger than 2. Each drive 21 is electrically connected with the corresponding motor 20 to drive the corresponding motor 20. The sensor 22 is used for sensing at least one operation parameter of the corresponding motor 20 and the motor-related mechanism 20a and providing the operation parameter to the corresponding drive 21. Preferably but not exclusively, the sensor 22 is built in the corresponding motor 20 and/or the motor-related mechanism 20a. Each controller 23 is electrically connected with the corresponding drive 21 to control the corresponding drive 21 to drive the operations of the corresponding motor 20. The functions and operations of the motors 20, the sensors 22 and the controllers 23 are similar to those mentioned above, and are not redundantly described herein.

Please refer to FIGS. 1, 2 and 3 again. The drive 21 can provide a modeling function, a controlling function, a measuring function and a diagnosing function, which are also referred as MCMD functions. Each drive 21 includes a real system driving module 21a and a virtual system driving module 21b. Under control of the controller 23, the real system driving module 21a of the drive 21 is selectively operated in the system identification mode, the processing mode or the idle mode. In the processing mode, the real system driving module 21a generates the mechanism real operation parameter information R1 according to the processing strategy C of the controller 23 and an external force disturbance TL. The virtual system driving module 21b of the drive 21 includes a quality measurement and mechanism diagnosis parameter processing module 21c. In the system identification mode, the quality measurement and mechanism diagnosis parameter processing module 21c creates at least one virtual mechanism model. In the processing mode or the idle mode, the quality measurement and mechanism diagnosis parameter processing module 21c generates the mechanism stimulation operation parameter information R2 according to the processing strategy C of the controller 23, the mechanism real operation parameter information R1 and the at least one virtual mechanism model. Consequently, the mechanism real operation parameter information R1 and the mechanism stimulation operation parameter information R2 can be provided from the drive 21 to the controller 23 or the local server 3. According to the changes of the mechanism real operation parameter information R1 and the mechanism stimulation operation parameter information R2 and the difference between the parameters, the controller 23 or the local server 3 estimates the quality of the product, diagnoses the health of the mechanism, predicts the deterioration and adjusts the processing strategy C. Consequently, the processing quality is optimized.

Figure 4:
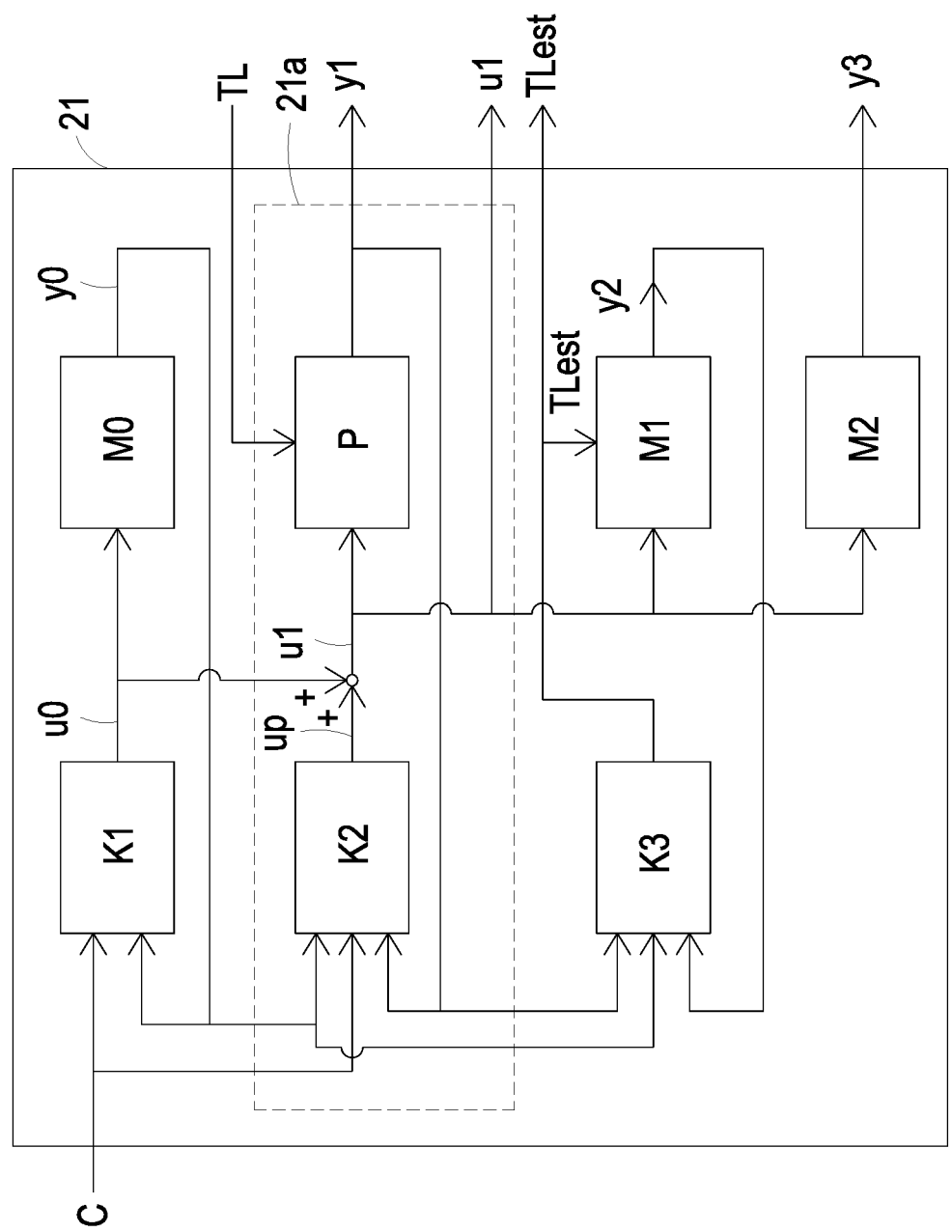
FIG. 4 is a schematic detailed control diagram illustrating the drive as shown in FIG. 3.

FIG. 4 is a schematic detailed control diagram illustrating the drive as shown in FIG. 3. In this embodiment, the real system driving module 21a of the drive 21 includes a real mechanism driving unit K2 and a controlled plant P. The quality measurement and mechanism diagnosis parameter processing module 21c of the virtual system driving module 21b of the drive 21 includes a virtual mechanism driving unit K1, an external force estimation unit K3 and at least one virtual mechanism model. The controlled plant P is created according to the motor 20 or the motor-related mechanism 20a, which is driven by the drive 21. Consequently, the controlled plant P can reflect the mechanism real operation parameter information R1 of the production device 2. Moreover, the mechanism real operation parameter information R1 is subjected to a change because of a long-term operation (e.g., the aging condition of the production device 2) and/or the external force disturbance. In fact, the external force disturbance exists when the motor 20 or the motor-related mechanism 20a is in the processing mode. Consequently, when the motor 20 or the motor-related mechanism 20a is in the processing mode, the controlled plant P receives the external force disturbance TL.

In this embodiment, the quality measurement and mechanism diagnosis parameter processing module 21c of the virtual system driving module 21b of the drive 21 includes a plurality of virtual mechanism models. For example, the plurality of virtual mechanism models include a first virtual mechanism model M0, a second virtual mechanism model M1 and a third virtual mechanism model M2. When the production device 2 is in the system identification mode, the first virtual mechanism model M0 is created according to the operation parameters of the motor 20, which is sensed by the sensor 22.

In fact, the first virtual mechanism model M0 is a simplified model when no external force disturbance is applied to the controlled plant P (i.e., the motor 20 or the motor-related mechanism 20a). That is, the first virtual mechanism model M0 is the model related to the main mechanical component of the controlled plant P, and the first virtual mechanism model M0 is created according to the operation parameters of the motor 20. Consequently, the first virtual mechanism model M0 reflects all physical parameters of the controlled plant P. For example, the physical parameters include the motive power parameters and the electric energy parameters. The second virtual mechanism model M1 and the third virtual mechanism model M2 are synchronously created according to the first virtual mechanism model M0. In other words, the first virtual mechanism model M0, the second virtual mechanism model M1 and the third virtual mechanism model M2 are the same type models with the same physical parameters. Especially, the second virtual mechanism model M1 receives a pre-estimated external force disturbance TLest.

After the production device 2 is enabled, the production device 2 enters the system identification mode. In the system identification mode, the virtual system driving module 21b of the drive 21 creates the first virtual mechanism model M0, the second virtual mechanism model M1 and the third virtual mechanism model M2 according to the operation parameters of the motor 20. By the way, the production device 2 enters the system identification mode during the start-up process of the production device 2.

The virtual mechanism driving unit K1 receives the processing strategy C of the controller 23. In the system identification mode, the virtual mechanism driving unit K1 issues a first driving command u0 to control the first virtual mechanism model M0. Preferably but not exclusively, the first driving command u0 includes a position command, a velocity command and/or a current command. According to the processing strategy C, a simulation operation is performed on the first virtual mechanism model M0. Consequently, a first simulated parameter information y0 is generated. The first simulated parameter information y0 is the operation parameter information of the controlled plant P in the system identification mode when no external force disturbance is applied to the controlled plant P. For example, the first simulated parameter information y0 reflects the position and the angular speed of the encoder of the motor 20 or the operation parameter information of the motor-related mechanism 20a.

The real mechanism driving unit K2 receives the processing strategy C from the controller 23 and generates a second driving command up. Preferably but not exclusively, the second driving command up includes a position command, a speed command and/or a current command. The second driving command up and the first driving command u0 are combined as a motor driving command u1. The controlled plant P is operated according to the motor driving command u1 and the processing strategy C of the controller 23. Consequently, the controlled plant P generates the motor operation parameter information y1. In an embodiment, the motor driving command u1 and the motor operation parameter information y1 are included in the mechanism real operation parameter information R1 of the real system driving module 21a. Similarly, according to the motor driving command u1, a simulation operation is performed on the second virtual mechanism model M1. Consequently, a second simulated parameter information y2 is generated. Similarly, according to the motor driving command u1, a simulation operation is performed on the third virtual mechanism model M2. Consequently, a third simulated parameter information y3 is generated. The second simulated parameter information y2 is generated in the processing mode. The third simulated parameter information y3 is generated in the idle mode.

The external force estimation unit K3 estimates the external force disturbance condition of the controlled plant P in the processing mode according to the motor operation parameter information y1 and the second simulated parameter information y2. Consequently, the external force estimation unit K3 generates the pre-estimated external force disturbance TLest and provides the pre-estimated external force disturbance TLest to the second virtual mechanism model M1. Moreover, the second virtual mechanism model M1 generates the adjusted second simulated parameter information y2 according to the motor driving command u1 and the pre-estimated external force disturbance TLest. The adjusted second simulated parameter information y2 is also fed back to the external force estimation unit K3. In an embodiment, the pre-estimated external force disturbance TLest and the third simulated parameter information y3 are included in the mechanism stimulation operation parameter information R2 of the virtual system driving module 21b.

As mentioned above, the first virtual mechanism model M0 is a simplified model of the controlled plant P. That is, the first virtual mechanism model M0 has the implication of the physical mechanism. Consequently, the first simulated parameter information y0 is the operation parameter information of the controlled plant P in the system identification mode when no external force disturbance is applied to the controlled plant P. For example, the first simulated parameter information y0 reflects the position and the speed of the motor 20 and/or the motor-related mechanism 20a. The motor operation parameter information y1 reflects the operation parameter information of the controlled plant P during the operation. That is, the motor operation parameter information y1 reflects the operation parameter information of the motor 20 and/or the motor-related mechanism 20a. The operation parameter information corresponding to the motor operation parameter information y1 is equivalent to the operation parameter information of the motor 20 and/or the motor-related mechanism 20a that is sensed by the sensor 22. The second simulated parameter information y2 reflects the operation parameter information of the controlled plant P in the processing mode when the pre-estimated external force disturbance TLest is received. As mentioned above, the second virtual mechanism model M1 and the controlled plant P are controlled according to the motor driving command u1. Consequently, if the motor operation parameter information y1 and the second simulated parameter information y2 are different, there is a difference between the real external force disturbance TL and the pre-estimated external force disturbance TLest. The external force estimation unit K3 adjusts the pre-estimated external force disturbance TLest according to the second simulated parameter information y2 from the second virtual mechanism model M1. Consequently, the pre-estimated external force disturbance TLest can accurately reflect the real external force disturbance TL received by the motor 20 and/or the motor-related mechanism 20a in the processing mode. According to the pre-estimated external force disturbance TLest from the virtual system driving module 21b of the drive 21 and the motor operation parameter information y1 from the real system driving module 21a of the drive 21, the controller 23 or the local server 3 measures and estimates the condition or quality of the processed product manufactured by the production device 2. Alternatively, the controller 23 or the local server 3 adjusts processing strategy C according to the external force disturbance, and thus the processed quality is optimized. The third simulated parameter information y3 reflects the operation parameter information of the controlled plant P in the idle mode. As mentioned above, the third virtual mechanism model M2 and the controlled plant P are controlled according to the motor driving command u1. In addition, the real external force disturbance TL is not received by the controlled plant P in the idle mode. Consequently, if the motor operation parameter information y1 and the third simulated parameter information y3 are different, there is a physical parameter difference between the controlled plant P and the third virtual mechanism model M2. The physical parameter difference reflects the operation parameter difference because of the mechanism aging phenomenon of the controlled plant P. According to the third simulated parameter information y3 from the virtual system driving module 21b of the drive 21, the controller 23 or the local server 3 diagnoses the health of the motor 20 and/or the motor-related mechanism 20a and predicts the deterioration (or aging condition) of the motor 20 and/or the motor-related mechanism 20a. Alternatively, the controller 23 or the local server 3 adjusts the processing strategy C according to the mechanism difference, and thus the processed quality is optimized. Moreover, the first virtual mechanism model M0, the second virtual mechanism model M1, and the third virtual mechanism model M2 are periodically modified or updated according to the third simulated parameter information y3. Consequently, the diagnosis accuracy is enhanced, the precise control of the motor 20 is achieved, and the processing quality of the production device 2 is optimized.

As mentioned above, the virtual system driving module 21b of the drive 21 creates the virtual mechanism models that reflect all physical parameters of the controlled plant P. These virtual mechanism models include the first virtual mechanism model M0, the second virtual mechanism model M1, and the third virtual mechanism model M2. Consequently, the drive 21 has the function of establishing models. Moreover, since the second virtual mechanism model M1 is created, the second simulated parameter information y2 of the second virtual mechanism model M1 can be used to estimate the influence of the external force disturbance on the condition or quality of the processed product when the production device 2 is in the processing mode. Consequently, the drive 21 has the measuring function. Moreover, the virtual mechanism models M0, M1, M2, the virtual mechanism driving unit K1, the real mechanism driving unit K2 and the external force estimation unit K3 of the drive 21 cooperate with each other to provide the mechanism real operation parameter information R1 (u1, y1) and the mechanism stimulation operation parameter information R2 (TLest, y3). Consequently, the processing strategy C of the controller 23 is dynamically adjusted and the motor 20 is precisely controlled. In other words, the drive 21 has the controlling function. Moreover, the third simulated parameter information y3 is provided from the third virtual mechanism model M2 of the drive 21 to the controller 23 or the local server 3. According to the third simulated parameter information y3, the controller 23 or the local server 3 diagnoses the health of the production device 2 and predicts the deterioration of the production device 2. In other words, the drive 21 has the function of diagnosing data.

In some embodiments, the first simulated parameter information y0 is fed back to the virtual mechanism driving unit K1, the real mechanism driving unit K2 and the external force estimation unit K3. The motor operation parameter information y1 is fed back to the real mechanism driving unit K2 and the external force estimation unit K3. The second simulated parameter information y2 is fed back to the external force estimation unit K3. Due to the feedback control, the accuracy of simulating the operation parameter information of the physical mechanism is increased. Consequently, the accuracy about the quality measurement and mechanism diagnosis of the production system 1 is increased.

In some embodiments, the production device 2 is a machine tool with a plurality of axles. The production device 2 includes a plurality of motors 20 and a plurality of drives 21. Each drive 21 and the corresponding motor 20 cooperate with each other to control one of the plurality of axles of the production device 2.

Please refer to FIG. 1 again. The production system 1 further includes a cloud server 4. The cloud server 4 is connected with the local server 3 through a communication network. The cloud server 4 can acquire the mechanism real operation parameter information R1 and the mechanism stimulation operation parameter information R2 of the drive 21 from the local server 3 through the communication network. Moreover, the mechanism real operation parameter information R1 and the mechanism stimulation operation parameter information R2 can be recorded, managed and analyzed by the cloud server 4.

In some embodiments, the drive 21 has a predetermined algorithm. The drive 21 generates virtual mechanism models M0, M1 and M2 according to an appropriate algorithm and the operation parameter information of the motor 20 and/or the motor-related mechanism 20a. In an embodiment, the algorithm is expressed by the following mathematic formula:

$$Jp\omega_{rm}+B\omega_{rm}+T_L=T_e;$$

$$(R_s+j\omega_e L_s+L_s p)i_s+j\omega_e\phi_F=v_s$$

In the above mathematic formulae, J is the inertia of the motor 20, B is the viscosity coefficient of the motor 20, p=d/dt is a differential operator, corm is the mechanical speed of the motor 20, $\omega_e$ is the electrical speed of the motor 20, TL is the external force loaded on the motor 20, $T_e$ is the electromagnetic torque of the motor 20, $L_s$ is the inductance of the stator of the motor 20, $R_s$ is the resistance of the stator of the motor 20, $i_s$ is the current of the stator of the motor 20, $v_s$ is the voltage of stator of the motor 20, $\phi_F$ is the magnetic flux of the motor 20, and j is the imaginary number.

After the algorithm is implemented, the virtual mechanism models M0, M1 and M2 contain the power parameters, electric energy parameters and other appropriate physical quantities corresponding to the motor 20 and/or the motor-related mechanism 20a. It is noted that the algorithm is not restricted.

It is noted that the number of the virtual mechanism models is not restricted. In case that some other factors or status need to be estimated and judged, the control architecture of the drive 21 may create four virtual mechanism models or more virtual mechanism models.

In some embodiments, the production device 2 includes additional external sensors (e.g., an accelerometer) in addition to the built-in sensors 22. Moreover, the operation parameters sensed by the external sensor can be used to establish the control mechanism of the drive 21. Consequently, the simulated parameter information provided by the first virtual mechanism model M0, the second virtual mechanism model M1, and the third virtual mechanism model M2 can be more accurate.

Figure 5:
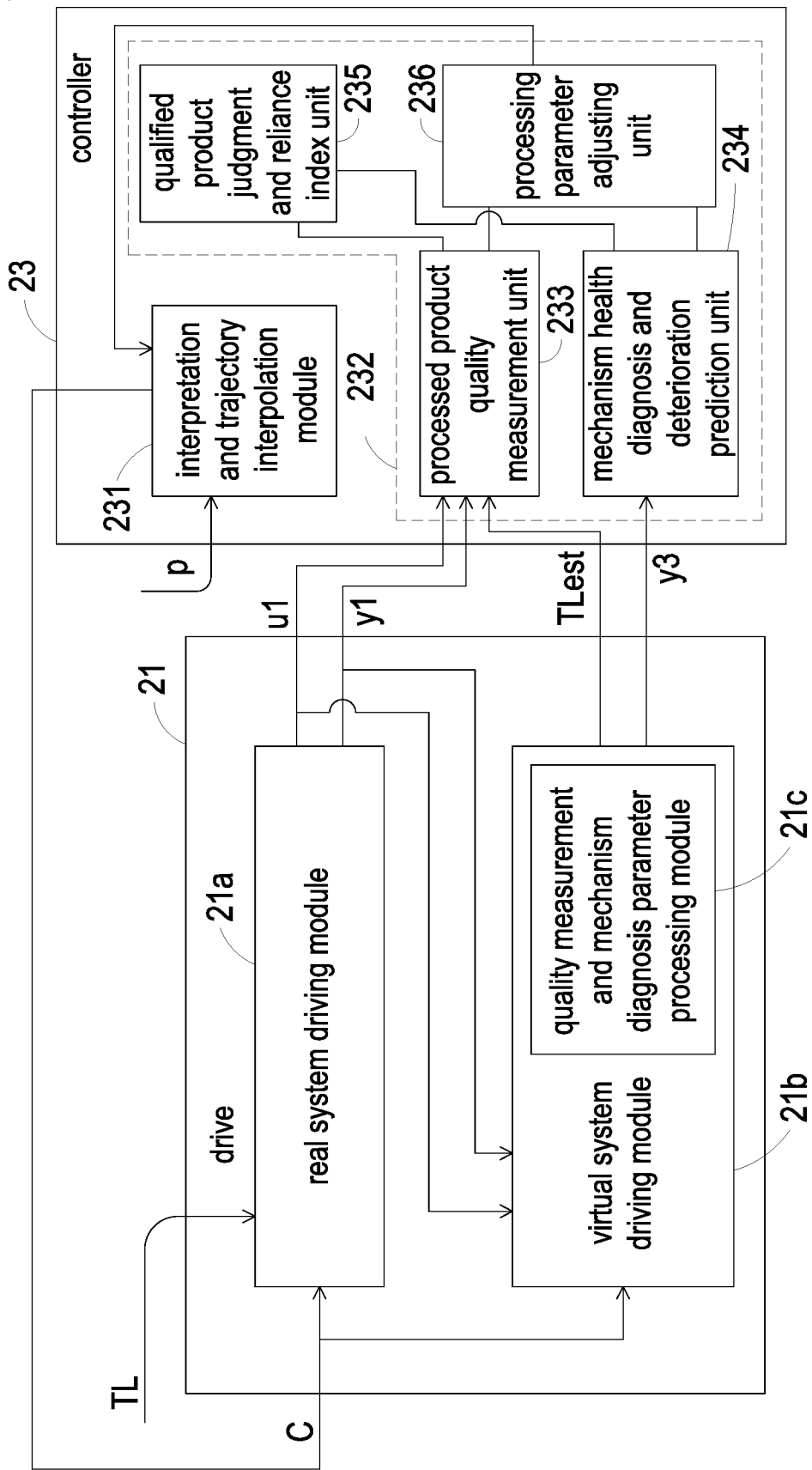
FIG. 5 is a schematic functional block diagram illustrating the first exemplary architecture of the production system for achieving the purpose of quality measurement and mechanism diagnosis.

FIG. 5 is a schematic functional block diagram illustrating the first exemplary architecture of the production system for achieving the purpose of quality measurement and mechanism diagnosis. Please refer to FIGS. 1, 2, 3, 4 and 5. The controller 23 of the production device 2 includes an interpretation and trajectory interpolation module 231 and a quality measurement and mechanism diagnosis module 232. The quality measurement and mechanism diagnosis module 232 includes a processed product quality measurement unit 233 and a mechanism health diagnosis and deterioration prediction unit 234. The interpretation and trajectory interpolation module 231 of the controller 23 receives a control command p from the user. After the interpretation and trajectory interpolation module 231 interprets the control command p and performs a position interpolation operation, the processing strategy C is generated. The processing strategy C is transmitted to the drive 21. The processed product quality measurement unit 233 of the controller 23 receives and stores the motor driving command u1 and the motor operation parameter information y1 of the mechanism real operation parameter information R1 from the drive 21. In addition, the processed product quality measurement unit 233 receives and stores the pre-estimated external force disturbance TLest of the mechanism stimulation operation parameter information R2. According to the historical data of the motor operation parameter information y1, the processed product quality measurement unit 233 measures and predicts the quality of the processed product by using a feature extraction method, a model prediction method or any other appropriate method. Moreover, according to the variation of the pre-estimated external force disturbance TLest, the processed product quality measurement unit 233 measures and predicts the quality of the processed product and performs accidental predictions. The mechanism health diagnosis and deterioration prediction unit 234 of the controller 23 receives and stores the third simulated parameter information y3 of the mechanism stimulation operation parameter information R2 from the drive 21. According to the variation of the third simulated parameter information y3, the mechanism health diagnosis and deterioration prediction unit 234 performs the mechanism health diagnosis and deterioration prediction process.

In some embodiments, the quality measurement and mechanism diagnosis module 232 of the controller 23 further includes a qualified product judgment and reliance index unit 235. The qualified product judgment and reliance index unit 235 receives the output information from the processed product quality measurement unit 233 and/or the output information from the mechanism health diagnosis and deterioration prediction unit 234. According to the output information, the qualified product judgment and reliance index unit 235 performs the qualified product judgment and provides the reliance index. Consequently, the measurement and judgment result can be viewed by the user.

In some embodiments, the quality measurement and mechanism diagnosis module 232 of the controller 23 further includes a processing parameter adjusting unit 236. The processing parameter adjusting unit 236 receives the output information from the processed product quality measurement unit 233 and/or the output information from the mechanism health diagnosis and deterioration prediction unit 234. According to the output information, the processing parameter adjusting unit 236 selectively adjusts the processing parameter. The adjusted processing parameter is transmitted to the interpretation and trajectory interpolation module 231. According to the adjusted processing parameter, the interpretation and trajectory interpolation module 231 generates the adjusted processing strategy C. The adjusted processing strategy C is transmitted to the drive 21. Consequently, the drive 21 can dynamically output the operation parameter to drive the processing operation of the motor 20 and optimize the processing quality.

Figure 6:
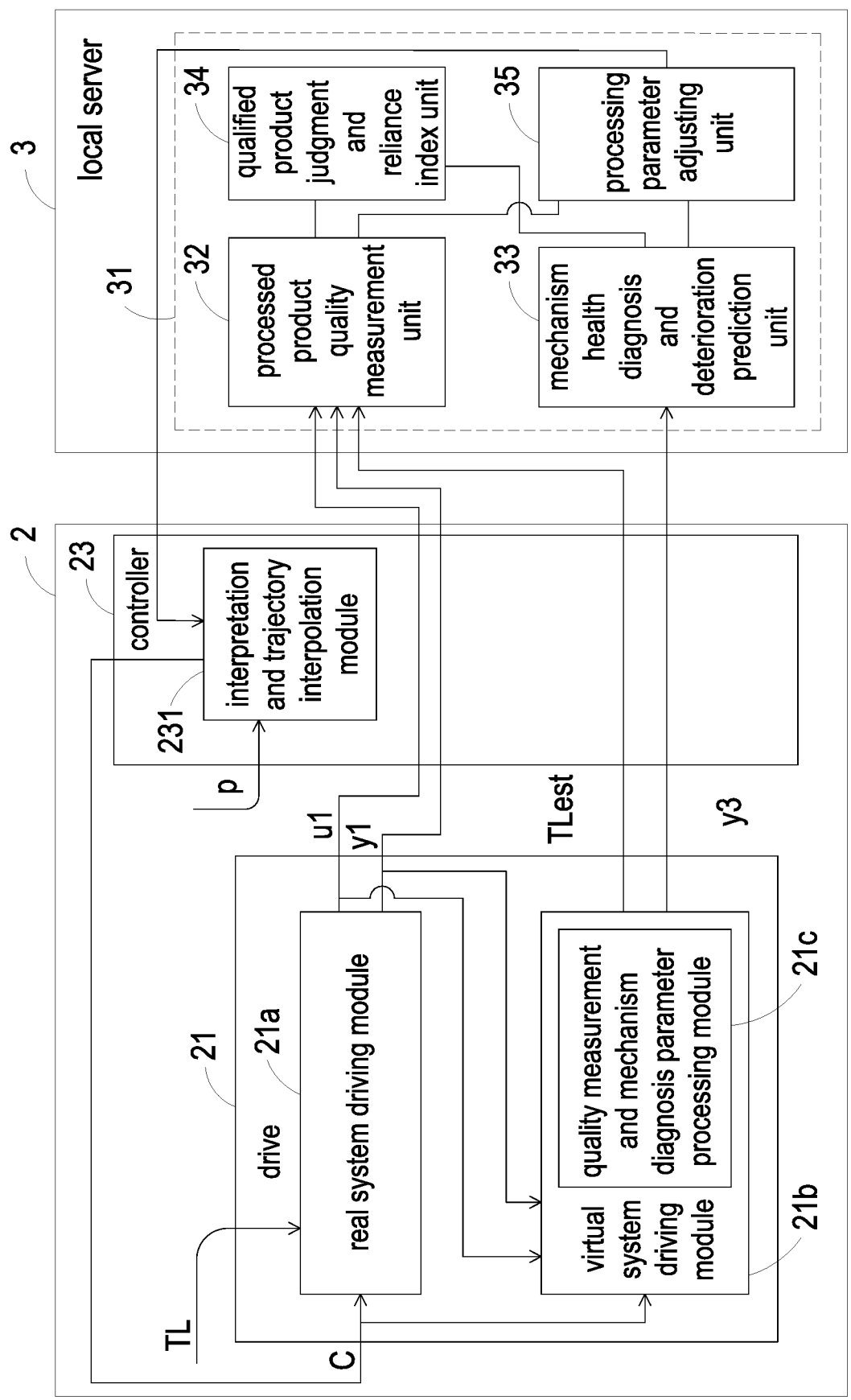
FIG. 6 is a schematic functional block diagram illustrating the second exemplary architecture of the production system for achieving the purpose of quality measurement and mechanism diagnosis.

FIG. 6 is a schematic functional block diagram illustrating the second exemplary architecture of the production system for achieving the purpose of quality measurement and mechanism diagnosis. Please refer to FIGS. 1, 2, 3, 4 and 6. In this embodiment, the controller 23 of the production system 1 includes an interpretation and trajectory interpolation module 231. The interpretation and trajectory interpolation module 231 of the controller 23 receives a control command p from the user. After the interpretation and trajectory interpolation module 231 interprets the control command p and performs a position interpolation operation, the processing strategy C is generated. The processing strategy C is transmitted to the drive 21. The local server 3 includes a quality measurement and mechanism diagnosis module 31. The quality measurement and mechanism diagnosis module 31 includes a processed product quality measurement unit 32 and a mechanism health diagnosis and deterioration prediction unit 33. The processed product quality measurement unit 32 of the local server 3 receives and stores the motor driving command u1 and the motor operation parameter information y1 of the mechanism real operation parameter information R1 from the drive 21. In addition, the processed product quality measurement unit 32 receives and stores the pre-estimated external force disturbance TLest of the mechanism stimulation operation parameter information R2. According to the historical data of the motor operation parameter information y1, the processed product quality measurement unit 32 of the local server 3 measures and predicts the quality of the processed product by using a feature extraction method, a model prediction method or any other appropriate method. Moreover, according to the variation of the-estimated external force disturbance TLest, the processed product quality measurement unit 32 measures and predicts the quality of the processed product and performs accidental predictions. The mechanism health diagnosis and deterioration prediction unit 33 of the local server 3 receives and stores the third simulated parameter information y3 of the mechanism stimulation operation parameter information R2 from the drive 21. According to the variation of the third simulated parameter information y3, the mechanism health diagnosis and deterioration prediction unit 33 performs the mechanism health diagnosis and deterioration prediction process.

In some embodiments, the quality measurement and mechanism diagnosis module 31 of the local server 3 further includes a qualified product judgment and reliance index unit 34. The qualified product judgment and reliance index unit 34 receives the output information from the processed product quality measurement unit 32 and/or the output information from the mechanism health diagnosis and deterioration prediction unit 33. According to the output information, the qualified product judgment and reliance index unit 34 performs the qualified product judgment and provides the reliance index. Consequently, the measurement and judgment result can be viewed by the user.

In some embodiments, the quality measurement and mechanism diagnosis module 31 of the local server 3 further includes a processing parameter adjusting unit 35. The processing parameter adjusting unit 35 receives the output information from the processed product quality measurement unit 32 and/or the output information from the mechanism health diagnosis and deterioration prediction unit 33. According to the output information, the processing parameter adjusting unit 35 selectively adjusts the processing parameter. The adjusted processing parameter is transmitted to the interpretation and trajectory interpolation module $23_1$ of the controller 23. According to the adjusted processing parameter, the interpretation and trajectory interpolation module $23_1$ generates the adjusted processing strategy C. The adjusted processing strategy C is transmitted to the drive 21. Consequently, the drive 21 can dynamically output the operation parameter to drive the processing operation of the motor 20 and optimize the processing quality.

In the embodiment of FIG. 5, the processed product quality measurement unit, the mechanism health diagnosis and deterioration prediction unit, the qualified product judgment and reliance index unit and the processing parameter adjusting unit of the quality measurement and mechanism diagnosis module are included in the controller 23. These components and the drive 21 cooperate to achieve the quality measurement and mechanism diagnosis function of the production system 1. In the embodiment of FIG. 6, the processed product quality measurement unit, the mechanism health diagnosis and deterioration prediction unit, the qualified product judgment and reliance index unit and the processing parameter adjusting unit of the quality measurement and mechanism diagnosis module are included in the local server 3. These components, the drive 21 and the controller 23 cooperate to achieve the quality measurement and mechanism diagnosis function of the production system 1. It is noted that numerous modifications and alterations may be made while retaining the teachings of the disclosure. For example, in another embodiment, some of the processed product quality measurement unit, the mechanism health diagnosis and deterioration prediction unit, the qualified product judgment and reliance index unit and the processing parameter adjusting unit are included in the controller 23 and the others are included in the local server 3. These components and the drive 21 cooperate to achieve the quality measurement and mechanism diagnosis function of the production system 1.

Figure 7:
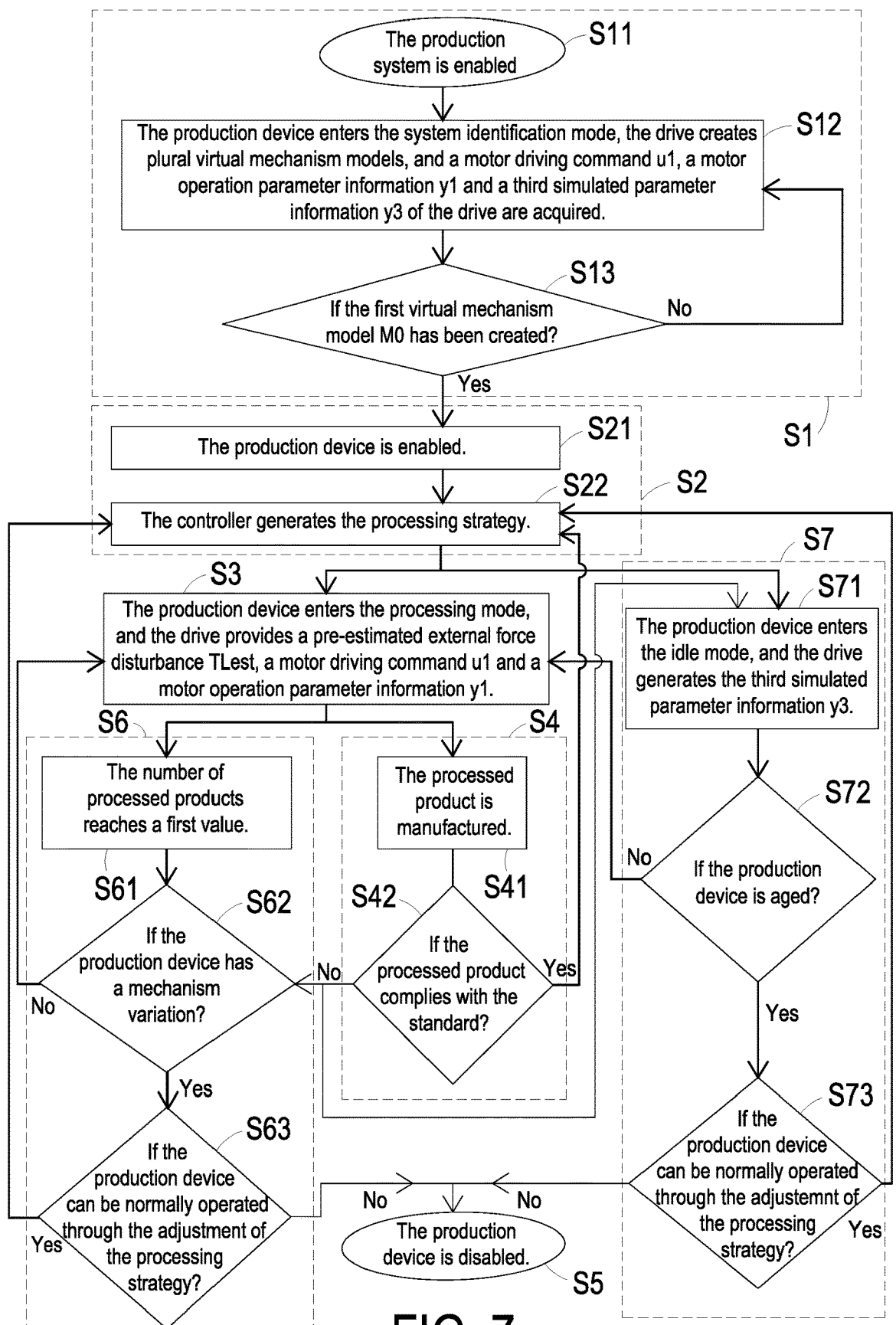
FIG. 7 is a flowchart illustrating an operating method of a production system according to an embodiment of the present disclosure.

The present disclosure further provides an operating method of the production system. FIG. 7 is a flowchart illustrating an operating method of a production system according to an embodiment of the present disclosure. The operating method will be described with reference to FIGS. 1 to 7.

Firstly, in a step S1, the production device 2 is enabled, and the production device 2 enters the system identification mode. The step S1 includes sub-steps S11, S12 and S13. In the sub-step S11, the production system 1 is enabled. In the sub-step S12, the production device 2 enters the system identification mode. Consequently, the virtual system driving module 21b of the drive 21 creates a first virtual mechanism model M0, a second virtual mechanism model M1 and a third virtual mechanism model M2. In addition, a motor driving command u1, a motor operation parameter information y1 and a third simulated parameter information y3 of the drive 21 are acquired. In an embodiment, the first virtual mechanism model M0, the second virtual mechanism model M1 and the third virtual mechanism model M2 are synchronously created according to an appropriate algorithm as described above. In an embodiment, the real mechanism driving unit K2 of the real system driving module 21a generates the motor driving command u1, and the controlled plant P of the real system driving module 21a generates the motor operation parameter information y1 according to the motor driving command u1. The second virtual mechanism model M1 generates a second simulated parameter information y2 according to the motor driving command u1 and a pre-estimated external force disturbance TLest. According to the motor operation parameter information y1 and the second simulated parameter information y2, the external force estimation unit K3 of the virtual system driving module 21b generates the pre-estimated external force disturbance TLest and provides the pre-estimated external force disturbance TLest to the second virtual mechanism model M1. The third virtual mechanism model M2 generates the third simulated parameter information y3 according to the motor driving command u1.

Then, in the sub-step S13, the drive 21 judges whether the first virtual mechanism model M0 has been created according to the motor operation parameter information y1 and the third simulated parameter information y3. In an embodiment, the drive 21 judges whether the first virtual mechanism model M0 has been created according to that the difference between the motor operation parameter information y1 and the third simulated parameter information y3 is smaller than or no less than a predetermined value. For example, if the difference between the motor operation parameter information y1 and the third simulated parameter information y3 is smaller than a predetermined value, the drive 21 judges that the first virtual mechanism model M0 corresponding to the simplified model of the controlled plant P has been created. Whereas, if the difference between the motor operation parameter information y1 and the third simulated parameter information y3 is larger than or equal to the predetermined value, the drive 21 judges that the first virtual mechanism model M0 corresponding to the simplified model of the controlled plant P has not been created. If the judging result of the step S13 is not satisfied, the step S12 is repeatedly done. Whereas, if the judging result of the step S13 is satisfied, the control architecture of the drive 21 has been created. That is, the first virtual mechanism model M0, the second virtual mechanism model M1, the third virtual mechanism model M2, the controlled plant P, the virtual mechanism driving unit K1, the real mechanism driving unit K2 and the external force estimation unit K3 have been created.

After the system identification mode is completed, a step S2 is performed. The controller 23 generates a processing strategy C to the drive 21 to drive the operation of the motor 20. The step S2 includes sub-steps S21 and S22. In the sub-step S21, the production device 2 is enabled. In the sub-step S22, the controller 21 generates the processing strategy C according to a control command p from the user and provides the processing strategy C to the drive 21. Consequently, the operations of the motor 20 are driven. If the production device 2 has the mechanism variation in the step S22 (e.g., the external force disturbance or the aging condition), the processing strategy C of the controller 23 is correspondingly adjusted.

After the step S2, a step S3 is performed. The production device 2 enters the processing mode. The real system driving module 21a of the drive 21 generates a mechanism real operation parameter information R1 according to the processing strategy C of the controller 23 and an external force disturbance TL, and the virtual system driving module 21b of the drive 21 generates a mechanism stimulation operation parameter information R2. The mechanism real operation parameter information R1 includes a motor driving command u1 and a motor operation parameter information y1. The mechanism stimulation operation parameter information R2 includes a pre-estimated external force disturbance TLest.

After the step S3, a step S4 is performed so that the production system 1 performs an estimating and measuring process. In the step S4, the production device 2 manufactures the processed product. The quality measurement and mechanism diagnosis module 232 (or 31) performs a quality measurement operation on the processed product according to the motor operation parameter information y1 and the pre-estimated external force disturbance TLest. Consequently, the total inspection purpose of estimating and measuring the quality of the processed product in real time is achieved. In the step S4, if the result of estimating and measuring the quality of the processed product complies with the standard, the step S3 is repeatedly done. In this embodiment, the step S4 includes the following sub-steps S41 and S42. Firstly, in the sub-step S41, the production device 2 manufactures the processed product. Then, in the sub-step S42, the quality measurement and mechanism diagnosis module 232 (or 31) performs the quality measurement operation on the processed product according to the motor operation parameter information y1 and the pre-estimated external force disturbance TLest so as to judge whether the result of the quality measurement operation on the processed product complies with the standard.

In another embodiment, a step S6 is performed after the step S3. In the step S3, the production system 1 performs a sampling inspection process. The sampling inspection process includes the following sub-steps S61, S62 and S63. In the sub-step S61, the number of processed products manufactured by the production device 2 reaches a first value X, and the processed products are subjected to the sampling inspection. Since the processed products are measured by a measuring device, the quality of the processed products can be accurately judged. In the sub-step S62, the quality measurement and mechanism diagnosis module 232 (or 31) judges whether the production device 2 has a mechanism variation according to the pre-estimated external force disturbance TLest. If the judging result of the sub-step S62 is not satisfied, the step S3 is repeatedly done. If the judging result of the sub-step S62 is satisfied, the sub-step S63 is performed. In the sub-step S63, the processing parameter adjusting unit 236 (or 35) of the quality measurement and mechanism diagnosis module 232 (or 31) judges whether the production device 2 can be normally operated in the processing mode through the adjustment of the processing strategy C. If the judging result of the sub-step S63 is satisfied, the processing parameter adjusting unit 236 (or 35) adjusts the processing strategy C and the sub-step S22 is performed. That is, the processing strategy C of the controller 23 is correspondingly adjusted. If the judging result of the sub-step S63 is not satisfied, a step S5 is performed to disable the production device 2.

In an embodiment, a step S7 is performed after the step S2. In the step S7, the production device 2 enters the idle mode. The step S7 includes the following sub-steps S71, S72 and S73. In the sub-step S71, the number of processed products manufactured by the production device 2 reaches a second value Y, and the production device 2 enters the idle mode. Under this circumstance, the production device 2 is still enabled but the production device 2 does not manufacture the processed product. According to the motor driving command u1, the virtual system driving module 21b of the drive 21 generates the third simulated parameter information y3 of the mechanism stimulation operation parameter information R2. In the sub-step S72, the mechanism health diagnosis and deterioration prediction unit 234 (or 33) of the quality measurement and mechanism diagnosis module 232 (or 31) performs the mechanism diagnosis operation according to the third simulated parameter information y3 so as to judge whether the production device 2 is aged. If the judging condition of the sub-step S72 is not satisfied, the step S3 is repeatedly done. If the judging condition of the sub-step S72 is satisfied, the sub-step S73 is performed. In the sub-step S73, the processing parameter adjusting unit 236 (or 35) of the quality measurement and mechanism diagnosis module 232 (or 31) judges whether the production device 2 can be normally operated in the processing mode through the adjustment of the processing strategy C. If the judging result of the sub-step S73 is satisfied, the processing parameter adjusting unit 236 (or 35) adjusts the processing strategy C and the step S2 is repeatedly done. That is, the processing strategy C of the controller 23 is correspondingly adjusted. If the judging result of the sub-step S73 is not satisfied, the step S5 is performed to disable the production device 2.

Since the aging condition of the production device 2 is slowly changed, it is not necessary to have the high sampling refresh rate. However, since the processed product is continuously and rapidly manufactured, it is necessary to have the high sampling refresh rate. Consequently, the second value Y is larger than the first value X. Whenever the number of processed products manufactured by the production device 2 reaches the first value X, the sampling inspection process is performed. Whenever the number of processed products manufactured by the production device 2 reaches the second value Y, the production device 2 enters the idle mode. The second value Y is larger than the first value X, wherein X and Y are positive integers.

If the result of the quality measurement operation on the processed product in the sub-step S42 does not comply with the standard, the sub-steps S62 and S63 are sequentially performed or the sub-steps S71, S72 and S73 are sequentially performed according to the practical requirements. In some embodiments, if the result of the quality measurement operation on the processed product in the sub-step S42 does not comply with the standard, the sub-step S62 is performed.

In the sub-step S62, the quality measurement and mechanism diagnosis module 232 (or 31) judges whether the production device 2 has a mechanism variation according to the pre-estimated external force disturbance TLest. If the judging result of the sub-step S62 is not satisfied, the step S3 is repeatedly done. If the judging result of the sub-step S62 is satisfied, the sub-step S63 is performed. In the sub-step S63, the processing parameter adjusting unit 236 (or 35) of the quality measurement and mechanism diagnosis module 232 (or 31) judges whether the production device 2 can be normally operated in the processing mode through the adjustment of the processing strategy C. If the judging result of the sub-step S63 is satisfied, the processing parameter adjusting unit 236 (or 35) adjusts the processing strategy C and the sub-step S22 is performed. That is, the processing strategy C of the controller 23 is correspondingly adjusted. If the judging result of the sub-step S63 is not satisfied, the step S5 is performed to disable the production device 2.

In some other embodiments, if the result of the quality measurement operation on the processed product in the sub-step S42 does not comply with the standard, the sub-step S71 is performed. In the sub-step S71, the number of processed products manufactured by the production device 2 reaches a second value Y, and the production device 2 enters the idle mode. Under this circumstance, the production device 2 is still enabled but the production device 2 does not manufacture the processed product. According to the motor driving command u1, the virtual system driving module 21b of the drive 21 generates the third simulated parameter information y3 of the mechanism stimulation operation parameter information R2. In the sub-step S72, the mechanism health diagnosis and deterioration prediction unit 234 (or 33) of the quality measurement and mechanism diagnosis module 232 (or 31) performs the mechanism diagnosis operation according to the third simulated parameter information y3 so as to judge whether the production device 2 is aged. If the judging condition of the sub-step S72 is not satisfied, the step S3 is repeatedly done. If the judging condition of the sub-step S72 is satisfied, the sub-step S73 is performed. In the sub-step S73, the processing parameter adjusting unit 236 (or 35) of the quality measurement and mechanism diagnosis module 232 (or 31) judges whether the production device 2 can be normally operated in the processing mode through the adjustment of the processing strategy C. If the judging result of the sub-step S73 is satisfied, the processing parameter adjusting unit 236 (or 35) adjusts the processing strategy C and the step S2 is repeatedly done. That is, the processing strategy C of the controller 23 is correspondingly adjusted. If the judging result of the sub-step S73 is not satisfied, the step S5 is performed to disable the production device 2.

Please refer to FIG. 7 again. In some embodiments, if the result of the quality measurement operation on the processed product complies with the standard, the production system 1 performs the process in the steps as indicated in relatively thick process lines. Namely, the production system 1 performs the sampling inspection process (i.e. step S6) without performing the step S5 to disable the production device 2 (i.e. the production device 2 has no mechanism variation, or the production device 2 has a mechanism variation but the production device 2 can be normally operated in the processing mode through the adjustment of the processing strategy C), or the production system 1 enters the idle mode (i.e. step S7) without performing the step S5 to disable the production device 2 (i.e. the production device 2 isn't aged, or the production device 2 is aged but the production device 2 can be normally operated in the processing mode through the adjustment of the processing strategy C).

Figure 8:
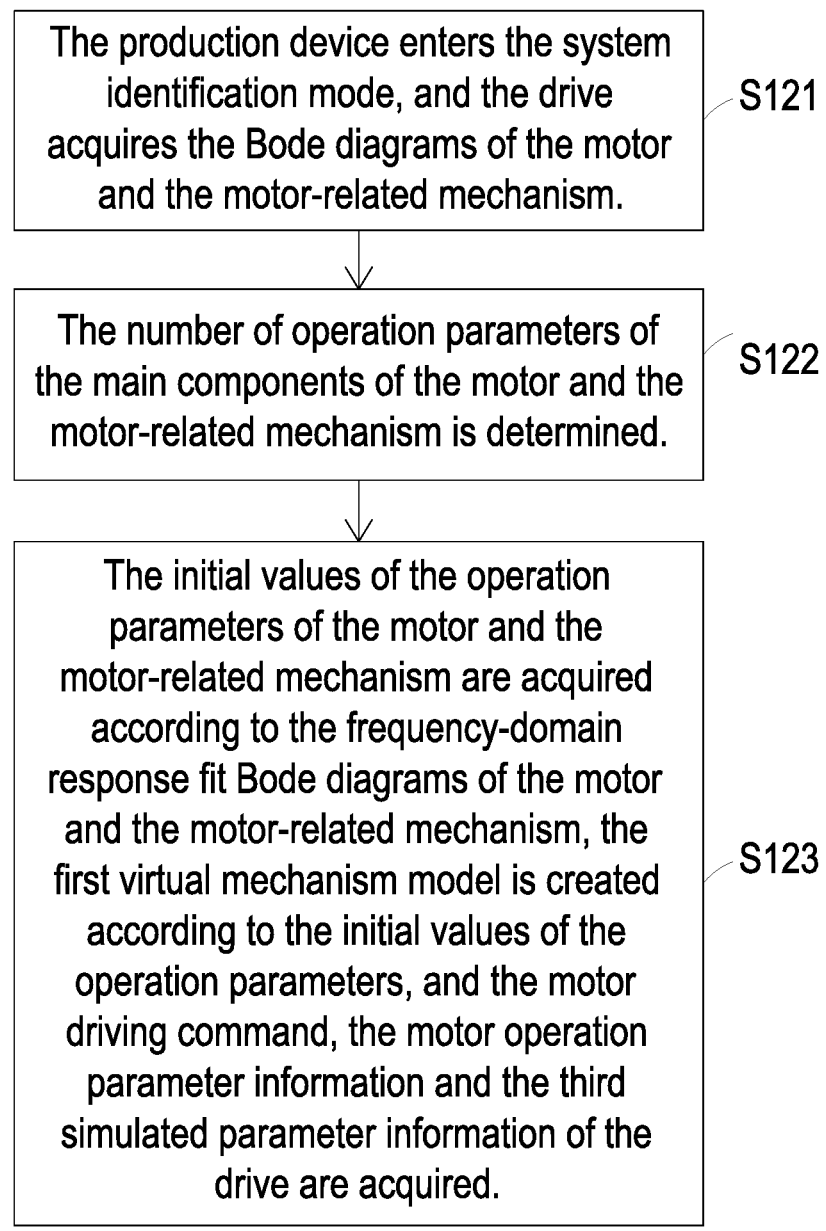
FIG. 8 is a flowchart illustrating the step S12 of the operating method as shown in FIG. 7.

FIG. 8 is a flowchart illustrating the step S12 of the operating method as shown in FIG. 7. In an embodiment, the step S12 further includes the sub-steps S121, S122 and S123. In the sub-step S121, the production device 2 is in the system identification mode, and the Bode diagrams of the motor 20 and the motor-related mechanism 20a are acquired by the drive 21. In the sub-step S122, the number of operation parameters of the main components of the motor 20 and the motor-related mechanism 20a is determined. In the sub-step S123, the initial values of the operation parameters of the motor 20 and the motor-related mechanism 20a are acquired according to the frequency-domain response fit Bode diagrams of the motor 20 and the motor-related mechanism 20a, the first virtual mechanism model M0 is created according to the initial values of the operation parameters, the second virtual mechanism model M1 and the third virtual mechanism model M2 are correspondingly created, and the motor driving command u1, the motor operation parameter information y1 and the third simulated parameter information y3 of the drive 21 are acquired. After the sub-step S122, the sub-step S13 is performed.

Figure 9:
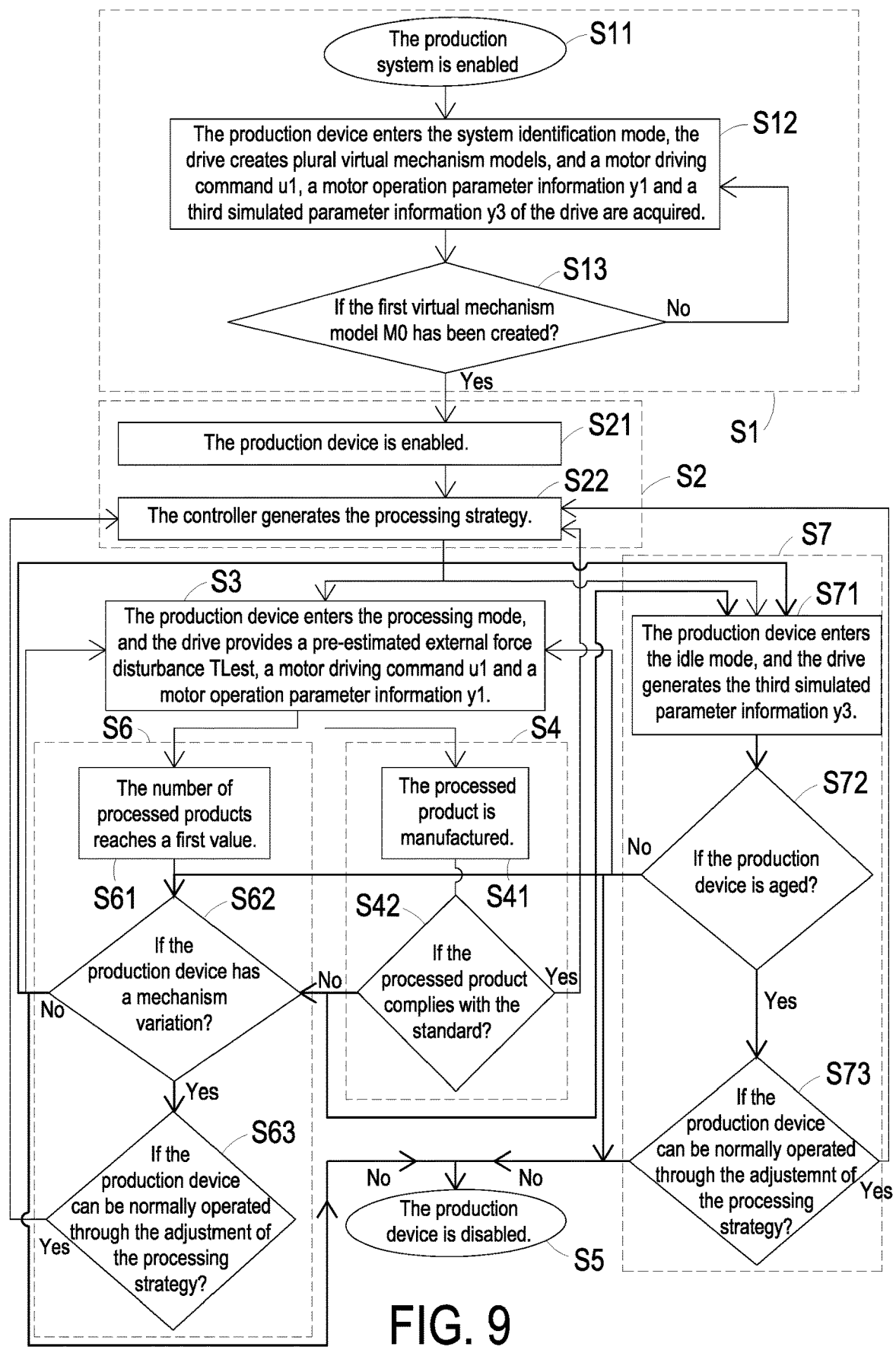
FIG. 9 is a flowchart illustrating an operating method of a production system according to another embodiment of the present disclosure.

FIG. 9 is a flowchart illustrating an operating method of a production system according to another embodiment of the present disclosure. The operating method of FIG. 9 performed by the production system 1 in this embodiment is similar to the operating method of FIG. 7. In comparison with the operating method of FIG. 7, if the result of the quality measurement operation on the processed product in the sub-step S42 does not comply with the standard, one of the following processes is selected to be performed according to the practical requirements. In some embodiments, the first process is selected. In the first process, if the result of the quality measurement operation on the processed product in the sub-step S42 does not comply with the standard, the sub-step S62 is performed to judge whether the production device 2 has a mechanism variation so as to confirm whether the result of the quality measurement operation on the processed product failing to comply with the standard is caused by the mechanism variation of production device 2. If the judging result of the sub-step S62 is not satisfied, the sub-steps S71 and S72 are performed subsequently. The sub-step S72 is performed to judge whether the production device 2 is aged, so as to confirm whether the result of the quality measurement operation on the processed product failing to comply with the standard is caused by the aging of production device 2. If the judging condition of the sub-step S72 is not satisfied, the step S5 is performed to disable the production device 2.

In some other embodiments, the second process is selected. In the second process, if the result of the quality measurement operation on the processed product in the sub-step S42 does not comply with the standard, the sub-steps S71 and S72 are performed subsequently. The sub-step S72 is performed to judge whether the production device 2 is aged, so as to confirm whether the result of the quality measurement operation on the processed product failing to comply with the standard is caused by the aging of production device 2. If the judging condition of the sub-step S72 is not satisfied, the sub-step S62 is performed to judge whether the production device 2 has a mechanism variation so as to confirm whether the result of the quality measurement operation on the processed product failing to comply with the standard is caused by the mechanism variation of production device 2. If the judging result of the sub-step S62 is not satisfied, the step S5 is performed to disable the production device 2. Consequently, the operating method of the present disclosure is capable of performing the quality measurement operation, performing the mechanism diagnosis operation and/or adjusting the processing strategy according to the practical requirements. In addition, the operating method of the present disclosure is capable of finding out the reasons why the processed products do not meet the standard by judging whether the production device 2 has a mechanism variation or judging whether the production device 2 is aged and is capable of allowing the production device 2 to be disabled when fails to find out the reasons.

Please refer to FIG. 9 again. In some embodiments, if the result of the quality measurement operation on the processed product in the sub-step S42 does not comply with the standard, the production system 1 performs the process in the steps as indicated in relatively thick process lines. Namely, if the result of the quality measurement operation on the processed product in the sub-step S42 does not comply with the standard, and if the reasons why the processed products do not meet the standard are failed to be found out by performing the sub-step S62 to judge whether the production device 2 has a mechanism variation and performing the sub-step S72 to judge whether the production device 2 is aged, the step S5 is performed to disable the production device 2. If the result of the quality measurement operation on the processed product in the sub-step S42 does not comply with the standard, and if the reasons why the processed products do not meet the standard are found out by performing the sub-step S62 to judge whether the production device 2 has a mechanism variation or performing the sub-step S72 to judge whether the production device 2 is aged but the sub-step S63 or the sub-step S73 is performed to determine that the production device 2 can't be normally operated in the processing mode through the adjustment of the processing strategy C, the step S5 is performed to disable the production device 2.

In accordance with the present disclosure, the production system 1 has a hierarchical processing structure. Since the amount of data sensed by the sensors 22 is very huge and the bandwidth of transferring data is limited, the conventional technology usually reduces the data accuracy and the data with the reduced data accuracy is transmitted to the server. For solving the drawbacks of the conventional virtual metrology technique using the aggregate calculation architecture, the production system 1 has the hierarchical processing structure. The hierarchical processing structure includes a plurality of data processing devices in multiple levels. The sensors 22 in the motor 20 and the motor-related mechanism 20a are configured as the first-level data processing device L1. The sensors 22 are operated at the high sampling rate (i.e., high resolution) to acquire the required operation parameters. After the data are processed by the sensors 22 and the required operation parameters are acquired, the operation parameters are transmitted to the second-level data processing device L2 (e.g., the drive 21) at a lower refresh rate. For example, the operation parameters of the motor 20 and the motor-related mechanism 20a are sensed at the frequency of 50 kHz. According to required information of the virtual mechanism models M0, M1 and M2, the operation parameters of the motor 20 and the motor-related mechanism 20a are transmitted to the drive 21 at the frequency of 20 kHz. Consequently, the virtual mechanism models M0, M1 and M2 are created by the drive 21. Similarly, the received operation data are processed into the motor driving command u1, the motor operation parameter information y1, the pre-estimated external force disturbance TLest and the third simulated parameter information y3 by the second-level data processing device L2. The motor driving command u1, the motor operation parameter information y1, the pre-estimated external force disturbance TLest and the third simulated parameter information y3 are transmitted to the third-level data processing device L3 (e.g., the controller 23) at the reduced refresh rate. After the received information is processed by the controller 23, the processed information is transmitted to the fourth-level data processing device L4 (e.g., the local server 3) at the further reduced refresh rate. The rest may be deduced by analogy.

The hierarchical processing structure of the production system 1 has many benefits. Since the sensors 22 are operated at the high sampling rate, the sensing accuracy is enhanced. Moreover, the transmission lines of the sensors 22 are not directly coupled to the local server 3 and the data are not directly transmitted from the sensors 22 to the local server 3. Instead, the operation parameter information is transmitted to and processed by the nearby drive 21 and the nearby controller 23. Consequently, the lengths of the transmission lines are shortened. Moreover, since the data processing tasks are distributed to the data processing devices in different levels, the performance of each data processing device is increased. In addition, the local server 3 does not need to have strong processing capacity and large memory capacity. Consequently, the cost of the hardware component is reduced. Moreover, the original or built-in sensors 22 of the production device 2 can be directly used by the production system 1, and the virtual mechanism models M0, M1 and M2 related to the motor 20 and with physical quantity meanings are created in the drive 21. Consequently, the controller 23 or the local server 3 can measure the quality of the processed product, perform the mechanism health diagnosis and predicts the deterioration condition according to the mechanism real operation parameter information R1 (u1, y1) and the mechanism stimulation operation parameter information R2 (TLest, y3), which are generated by the real system driving module 21a and the virtual mechanism models M0, M1 and M2 of the virtual system driving module 21b. Since it is not necessary to additionally install a great number of sensors in the production device 2, the test cost is largely reduced. Moreover, since the virtual mechanism models M0, M1 and M2 contain the physical quantity meanings of the motor 20 and/or the motor-related mechanism 20a and provide more accurate simulated operation parameter information, the controller 23 or the local server 3 can accurately recognize the causes of the unqualified processed product. Consequently, the processing strategy C of the controller 23 can be correspondingly adjusted and improved. In some embodiments, the cloud sever 4 is configured as the fifth-level data processing device L5 to perform the information encoding task in the very low sampling rate.

Figure 10:
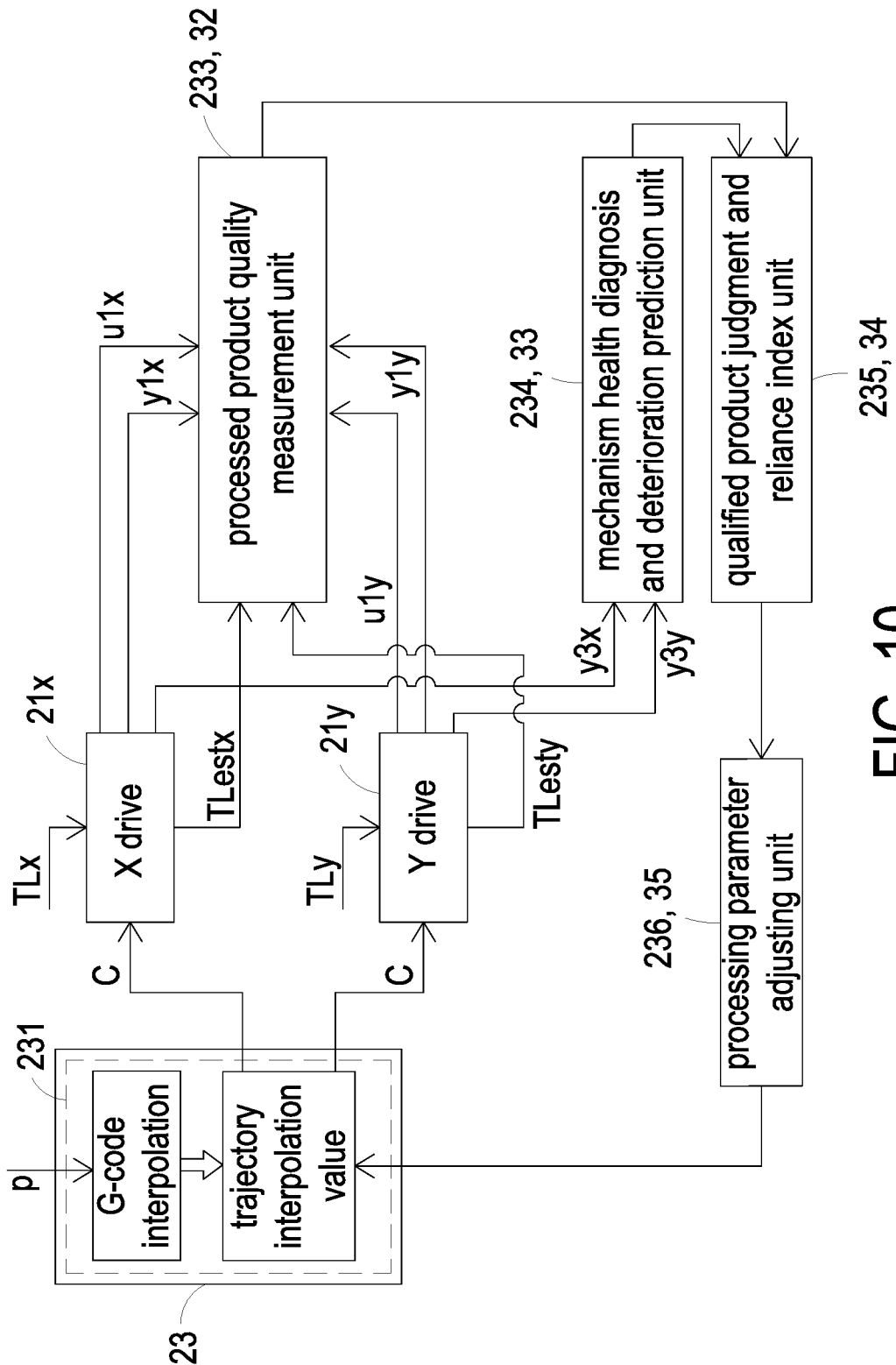
FIG. 10 is a schematic functional block diagram illustrating the architecture of a production system for a machine tool.

FIG. 10 is a schematic functional block diagram illustrating the architecture of a production system for a machine tool. In an embodiment, the production device 2 of the production system 1 is applied to a 2D milling machine. The 2D milling machine is a two axle (XY) machine tool. The X drive 21x is used for controlling the motor 20 in the X axis. The Y drive 21y is used for controlling the motor 20 in the Y axis. Please refer to FIGS. 1 to 6 and FIG. 10. After the G-code control command p from the user is received by the controller 23, the interpretation and trajectory interpolation module 231 of the controller 23 performs a G-code interpolation on the G-code control command p. According to the interpolation result, the trajectory interpolation value is obtained. Consequently, the XY-axis motion trajectory of the production device 2 is determined. In addition, the processing strategy C is transmitted to the X drive 21x and the Y drive 21y. While the X drive 21x and the Y drive 21y drive the operations of the corresponding motors 20 according to the processing strategy C, the X drive 21x receives the external force disturbance TLx and generates the motor driving command u1x, the motor operation parameter information y1x, the third simulated parameter information y3x and the pre-estimated external force disturbance TLestx. In addition, the Y drive 21y receives the external force disturbance TLy and generates the motor driving command u1y, the motor operation parameter information y1y, the third simulated parameter information y3y and the pre-estimated external force disturbance TLesty. Then, the controller 23 of the production device 2 or the local server 3 extracts features, predicts models and predicts accidents through the processed product quality measurement unit 233 (or 32) of the quality measurement and mechanism diagnosis module 232 (or 31) according to the motor operation parameter information y1x, the pre-estimated external force disturbance TLestx, the motor operation parameter information y1y and the pre-estimated external force disturbance TLesty. In some embodiments, the measurement on the size error of the processed product can realize the processing condition and the quality of the processed product. The operations of the processed product quality measurement unit 233 (or 32) are similar to those mentioned above, and are not redundantly described herein. The mechanism health diagnosis and deterioration prediction unit 234 (or 33) of the quality measurement and mechanism diagnosis module 232 (or 31) performs the mechanism diagnosis operation according to the third simulated parameter information y3x and the third simulated parameter information y3y so as to judge whether the production device 2 is aged or evaluate the aging index of the production device 2. The operations of the mechanism health diagnosis and deterioration prediction unit 234 (or 33) are similar to those mentioned above, and are not redundantly described herein. Then, the qualified product judgment and reliance index unit 235 (or 34) of the quality measurement and mechanism diagnosis module 232 (or 31) of the controller 23 or the local server 3 performs the qualified product judgment and provides the reliance index according to the output information from the processed product quality measurement unit 233 (or 31) and the output information from the mechanism health diagnosis and deterioration prediction unit 234 (or 33). In some embodiments, the processing parameter adjusting unit 23 of the quality measurement and mechanism diagnosis module 232 (or 31) of the controller 23 or the local server 3 adjusts the processing strategy C according to the output information from the qualified product judgment and reliance index unit 235 (or 34), or the output information from the processed product quality measurement unit 233 (or 32) and the output information from the mechanism health diagnosis and deterioration prediction unit 234 (or 33). After the controller 23 receives the processing strategy C and the controller 23 interprets the control command and performs the position interpolation operation, the XY-axis motion trajectory of the production device 2 is planed again. Consequently, the X drive 21x and the Y drive 21y are operated according to the adjusted processing strategy C.

From the above descriptions, the present disclosure provides a production system, a drive and an operating method of the production system in order to measure and monitor the quality of the product, perform the mechanism diagnosis operation, predict the deterioration and achieve the intelligent control function. The production system and the drive provide the MCMD function. The hierarchical processing structure of the production system can reduce the burdens of transferring and computing data, simplify the wiring structure, increase the operating efficiency, predict the product quality immediately, predict the external force disturbance, increase the prediction accuracy, monitor the production capability of the production device, adjust the processing strategy according to the mechanism variation, optimize the production capability, perform the mechanism diagnosis operation, predict the deterioration and reduce the hardware and measuring cost.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A drive for driving a motor of a production device, the drive being controlled by a controller of the production device, the production device being selectively in a system identification mode, a processing mode or an idle mode, the production device manufacturing a processed product in the processing mode, the drive comprising:
    a real system driving module, wherein when the production device is in the processing mode, the real system driving module generates a mechanism real operation parameter information according to a processing strategy of the controller and an external force disturbance; and
    a virtual system driving module comprising a quality measurement and mechanism diagnosis parameter processing module, wherein when the production device is in the system identification mode, the quality measurement and mechanism diagnosis parameter processing module creates at least one virtual mechanism model, wherein when the production device is in the processing mode or the idle mode, the quality measurement and mechanism diagnosis parameter processing module generates a mechanism stimulation operation parameter information according to the processing strategy of the controller, the mechanism real operation parameter information and the at least one virtual mechanism model,
    wherein the mechanism real operation parameter information and the mechanism stimulation operation parameter information are transmitted to the controller so as to perform a quality measurement operation, perform a mechanism diagnosis operation and/or adjust the processing strategy.

2. The drive according to claim 1, wherein the real system driving module comprises:
    a real mechanism driving unit receiving the processing strategy, and generating a motor driving command according to the processing strategy; and
    a controlled plant comprising the motor and a motor-related mechanism, wherein when the production device is in the processing mode, the controlled plant receives the motor driving command and the external force disturbance and generates a motor operation parameter information,
    wherein the motor driving command and the motor operation parameter information are included in the mechanism real operation parameter information.

3. The drive according to claim 2, wherein the quality measurement and mechanism diagnosis parameter processing module of the virtual system driving module comprises:
    a first virtual mechanism model, wherein when the production device is in the system identification mode, the first virtual mechanism model is created according to a mechanical component of the controlled plant, wherein the first virtual mechanism model reflects physical parameters of the controlled plant;
    a virtual mechanism driving unit receiving the processing strategy of the controller, and issuing a first driving command to the first virtual mechanism model, wherein the first virtual mechanism model generates a first simulated parameter information according to the first driving command;
    a second virtual mechanism model created according to the first virtual mechanism model, and receiving a pre-estimated external force disturbance, wherein when the production device is in the processing mode, the second virtual mechanism model generates a second simulated parameter information according to the motor driving command;
    an external force estimation unit, wherein when the production device is in the processing mode, the external force estimation unit generates the pre-estimated external force disturbance to the second virtual mechanism model according to the second simulated parameter information and the motor operation parameter information; and
    a third virtual mechanism model created according to the first virtual mechanism model, wherein when the production device is in the idle mode, the third virtual mechanism model generates a third simulated parameter information according to the motor driving command,
    wherein the real mechanism driving unit generates a second driving command according to the processing strategy, and the first driving command and the second driving command are combined as the motor driving command,
    wherein the pre-estimated external force disturbance and the third simulated parameter information are included in the mechanism stimulation operation parameter information.

4. The drive according to claim 3, wherein the quality measurement operation is performed according to the motor operation parameter information and the pre-estimated external force disturbance, the mechanism diagnosis operation is performed according to the third simulated parameter information, and the processing strategy is adjusted according to results of the quality measurement operation and the mechanism diagnosis operation.

5. The drive according to claim 3, wherein the first simulated parameter information is fed back to the virtual mechanism driving unit, the real mechanism driving unit and the external force estimation unit, the motor operation parameter information is fed back to the real mechanism driving unit and the external force estimation unit, and the second simulated parameter information is fed back to the external force estimation unit.

6. A production system, comprising:
    a production device selectively operated in a system identification mode, a processing mode or an idle mode, wherein the production device manufactures a processed product in the processing mode, wherein the production device comprises:

at least one motor;

at least one sensor configured to sense the at least one motor and a motor-related mechanism to acquire at least one operation parameter;

at least one controller configured to provide a processing strategy; and at least one drive connected with the at least one motor and the at least one controller to receive the at least one operation parameter from the at least one sensor and drive operations of the motor according to the processing strategy, wherein the drive comprises:

a real system driving module, wherein when the production device is in the processing mode, the real system driving module generates a mechanism real operation parameter information according to the processing strategy of the controller and an external force disturbance; and a virtual system driving module comprising a quality measurement and mechanism diagnosis parameter processing module, wherein when the production device is in the system identification mode, the quality measurement and mechanism diagnosis parameter processing module creates at least one virtual mechanism model, wherein when the production device is in the processing mode or the idle mode, the quality measurement and mechanism diagnosis parameter processing module generates a mechanism stimulation operation parameter information according to the processing strategy of the controller, the mechanism real operation parameter information and the at least one virtual mechanism model;

a server connected with the controller; and a quality measurement and mechanism diagnosis module installed in at least one of the controller and the server, wherein the quality measurement and mechanism diagnosis module performs a quality measurement operation, performs a mechanism diagnosis operation and/or adjusts the processing strategy according to the mechanism real operation parameter information and the mechanism stimulation operation parameter information.

7. The production system according to claim 6, wherein the real system driving module comprises:

a real mechanism driving unit receiving the processing strategy, and generating a motor driving command according to the processing strategy; and a controlled plant comprising the motor and the motor-related mechanism, wherein when the production device is in the processing mode, the controlled plant receives the motor driving command and the external force disturbance and generates a motor operation parameter information, wherein the motor driving command and the motor operation parameter information are included in the mechanism real operation parameter information.

8. The production system according to claim 7, wherein the quality measurement and mechanism diagnosis parameter processing module of the virtual system driving module comprises:

a first virtual mechanism model, wherein when the production device is in the system identification mode, the first virtual mechanism model is created according to a mechanical component of the controlled plant, wherein the first virtual mechanism model reflects physical parameters of the controlled plant;

a virtual mechanism driving unit receiving the processing strategy of the controller, and issuing a first driving command to the first virtual mechanism model, wherein the first virtual mechanism model generates a first simulated parameter information according to the first driving command;

a second virtual mechanism model created according to the first virtual mechanism model, and receiving a pre-estimated external force disturbance, wherein when the production device is in the processing mode, the second virtual mechanism model generates a second simulated parameter information according to the motor driving command;

an external force estimation unit, wherein when the production device is in the processing mode, the external force estimation unit generates the pre-estimated external force disturbance to the second virtual mechanism model according to the second simulated parameter information and the motor operation parameter information; and a third virtual mechanism model created according to the first virtual mechanism model, wherein when the production device is in the idle mode, the third virtual mechanism model generates a third simulated parameter information according to the motor driving command, wherein the real mechanism driving unit generates a second driving command according to the processing strategy, and the first driving command and the second driving command are combined as the motor driving command, wherein the pre-estimated external force disturbance and the third simulated parameter information are included in the mechanism stimulation operation parameter information, wherein the first simulated parameter information is fed back to the virtual mechanism driving unit, the real mechanism driving unit and the external force estimation unit, the motor operation parameter information is fed back to the real mechanism driving unit and the external force estimation unit, and the second simulated parameter information is fed back to the external force estimation unit.

9. The production system according to claim 8, wherein the quality measurement and mechanism diagnosis module comprises:

a processed product quality measurement unit receiving the motor driving command and the motor operation parameter information of the mechanism real operation parameter information from the drive, and receiving the pre-estimated external force disturbance of the mechanism stimulation operation parameter information, wherein the processed product quality measurement unit measures and predicts the quality of the processed product according to the motor operation parameter information and the pre-estimated external force disturbance; and a mechanism health diagnosis and deterioration prediction unit receiving the third simulated parameter information of the mechanism stimulation operation parameter information from the drive, wherein the mechanism health diagnosis and deterioration prediction unit performs a mechanism health diagnosis and deterioration prediction process according to the third simulated parameter information.

10. The production system according to claim 9, wherein the quality measurement and mechanism diagnosis module further comprises:
a qualified product judgment and reliance index unit receiving an output information from the processed product quality measurement unit or the mechanism health diagnosis and deterioration prediction unit, wherein the qualified product judgment and reliance index unit provides a reliance index according to the output information; and
a processing parameter adjusting unit receiving the output information from the processed product quality measurement unit or the mechanism health diagnosis and deterioration prediction unit, wherein the processing parameter adjusting unit selectively adjusts the processing strategy according to the output information.

11. The production system according to claim 6, wherein the controller comprises an interpretation and trajectory interpolation module to receive a control command from a user, wherein after the interpretation and trajectory interpolation module interprets the control command and performs a position interpolation operation, the processing strategy is generated and sent to the drive.

12. The production system according to claim 6, wherein the production system has a hierarchical processing structure that comprises a plurality of data processing devices in multiple levels, wherein the at least one sensor disposed in the motor is a first-level data processing device, the at least one drive is a second-level data processing device, the at least one controller is a third-level data processing device, and the server is a fourth-level data processing device.

13. The production system according to claim 6, further comprising a cloud server, wherein the cloud server is connected with the server to receive and store the information from the server.

14. An operating method for a production system, the production system comprising a production device, a server and a quality measurement and mechanism diagnosis module, the production device comprising at least one motor, at least one sensor, at least one controller and at least one drive, the drive comprising a real system driving module and a virtual system driving module, the quality measurement and mechanism diagnosis module being installed in at least one of the controller and the local server, the operating method comprising steps of:
(S1) the production device entering a system identification mode, and the virtual system driving module of the drive creating at least one virtual mechanism model;
(S2) the controller generating a processing strategy and sending the processing strategy to the drive to drive operations of the motor;
(S3) the production device entering a processing mode, the real system driving module of the drive generating a mechanism real operation parameter information according to the processing strategy of the controller and an external force disturbance and the virtual system driving module generating a mechanism stimulation operation parameter information according to the processing strategy of the controller, the mechanism real operation parameter information and the at least one virtual mechanism model, wherein the mechanism real operation parameter information includes a motor driving command and a motor operation parameter information, and the mechanism stimulation operation parameter information includes a pre-estimated external force disturbance; and
(S4) the production device manufacturing at least one processed product, wherein the quality measurement and mechanism diagnosis module performs a quality measurement operation on the processed product according to the motor operation parameter information and the pre-estimated external force disturbance.

15. The operating method according to claim 14, further comprising a step (S6) of performing a sampling inspection process, wherein the step (S6) comprises sub-steps of:
(S61) if the number of the at least one processed product manufactured by the production device reaches a first value, allowing the at least one processed product to undergo sampling inspection; and
(S62) the quality measurement and mechanism diagnosis module judging whether the production device has a mechanism variation according to the pre-estimated external force disturbance, wherein if the production device does not undergo the mechanism variation, the step (S3) is repeatedly done.

16. The operating method according to claim 15, further comprising a step (S7) of allowing the production device to enter an idle mode, wherein the step (S7) comprises sub-steps of:
(S71) the production device entering the idle mode, wherein the production device is still enabled but the production device does not manufacture the processed product, and the virtual system driving module of the drive generates a third simulated parameter information of the mechanism stimulation operation parameter information according to the motor driving command; and
(S72) a mechanism health diagnosis and deterioration prediction unit of the quality measurement and mechanism diagnosis module performing the mechanism diagnosis operation according to the third simulated parameter information so as to judge whether the production device is aged, wherein if the production device is not aged, the step (S3) is repeatedly done.

17. The operating method according to claim 16, wherein if the number of the at least one processed product manufactured by the production device reaches a second value, the sub-step (S71) is performed, wherein the second value is larger than the first value.

18. The operating method according to claim 16, wherein if a result of the quality measurement operation on the processed product in the step (S4) complies with a standard, the step (S3) is repeatedly done; and wherein if the result of the quality measurement operation on the processed product in the step (S4) does not comply with the standard, the sub-step (S62) is performed to judge whether the production device has the mechanism variation, wherein if the judging result of the sub-step (S62) is not satisfied, the sub-steps (S71) and (S72) are performed subsequently, wherein the sub-step (S72) is performed to judge whether the production device is aged, wherein if the judging condition of the sub-step (S72) is not satisfied, a step (S5) is performed to disable the production device; or wherein if the result of the quality measurement operation on the processed product in the step (S4) does not comply with the standard, the sub-steps (S71) and (S72) are performed subsequently, wherein the sub-step (S72) is performed to judge whether the production device is aged, wherein if the judging condition of the sub-step (S72) is not satisfied, the sub-step (S62) is performed to judge whether the production device has the mechanism variation, wherein if the judging result of the sub-step (S62) is not satisfied, a step (S5) is performed to disable the production device.

19. The operating method according to claim 14, wherein the step (S1) comprises sub-steps of:
- (S11) enabling the production device;
- (S12) the production device entering the system identification mode, and the drive creating a first virtual mechanism model, a second virtual mechanism model and a third virtual mechanism model of the at least one virtual mechanism model, wherein a real mechanism driving unit of the real system driving module generates the motor driving command, and a controlled plant of the real system driving module generates the motor operation parameter information, wherein the second virtual mechanism model generates a second simulated parameter information according to the motor driving command and a pre-estimated external force disturbance, an external force estimation unit of the virtual system driving module generates the pre-estimated external force disturbance to the second virtual mechanism model according to the motor operation parameter information and the second simulated parameter information, and the third virtual mechanism model generates a third simulated parameter information according to the motor driving command; and
- (S13) judging whether the first virtual mechanism model has been created according to the motor operation parameter information and the third simulated parameter information, wherein if the first virtual mechanism model has not been created, the sub-step (S12) is repeatedly done.

* * * * *